(12) United States Patent
Sreetharan et al.

(10) Patent No.: US 11,325,828 B2
(45) Date of Patent: May 10, 2022

(54) HIGH-VOLUME MILLIMETER SCALE MANUFACTURING

(71) Applicant: VIBRANT COMPOSITES, INC., Boston, MA (US)

(72) Inventors: Pratheev S. Sreetharan, Cambridge, MA (US); Andrew Baisch, Cambridge, MA (US); Alina Visco, Somerville, MA (US); Michael Karpelson, Newton, MA (US)

(73) Assignee: Vibrant Composites Inc., Boston, MA (US)

( * ) Notice: Subject to any disclaimer, the term of this patent is extended or adjusted under 35 U.S.C. 154(b) by 0 days.

(21) Appl. No.: 16/279,966

(22) Filed: Feb. 19, 2019

(65) Prior Publication Data

US 2019/0256353 A1    Aug. 22, 2019

Related U.S. Application Data

(63) Continuation of application No. PCT/US2017/047869, filed on Aug. 21, 2017, and a continuation-in-part of application No. 16/173,922, filed on Oct. 29, 2018, now Pat. No. 10,710,118, which is a continuation of application No. PCT/US2017/029975, filed on Apr. 27, 2017, application No. 16/279,966, filed on Feb. 19, 2019, which is a continuation-in-part of application No.
(Continued)

(51) Int. Cl.
*B81C 1/00* (2006.01)
*B06B 1/04* (2006.01)
*B06B 1/10* (2006.01)

(52) U.S. Cl.
CPC ......... *B81C 1/00357* (2013.01); *B06B 1/045* (2013.01); *B81C 1/0019* (2013.01); *B81C 1/00142* (2013.01); *B81C 1/00428* (2013.01); *B81C 1/00492* (2013.01); *B81C 1/00547* (2013.01); *B06B 1/10* (2013.01); *B81C 2201/0102* (2013.01); *B81C 2201/0135* (2013.01)

(58) Field of Classification Search
USPC .................................................. 156/247, 249
See application file for complete search history.

(56) References Cited

U.S. PATENT DOCUMENTS 6,150,615 A * 11/2000 Suzuki ................ H01L 23/3121
                                                                    174/255
6,905,620 B2    6/2005 Silverbrook
(Continued)

*Primary Examiner* — Linda L Gray
(74) *Attorney, Agent, or Firm* — Bergman LLC; Michael Bergman

(57) ABSTRACT

A method for manufacturing a millimeter scale electromechanical device includes coupling a stainless steel ply to a polymer carrier ply, coating the stainless steel ply in a photo resist material, masking the photoresist material, exposing the photoresist material to cure a portion of the photoresist material, developing the photoresist material to remove uncured photoresist material from the stainless steel ply, chemically etching the stainless steel ply to remove a patterned portion of the stainless steel ply, dissolving the polymer carrier ply to release unwanted chips of the stainless steel ply, and adhering the patterned stainless steel ply to a flexible material ply to form a sub-laminate.

18 Claims, 30 Drawing Sheets

Related U.S. Application Data

16/173,922, which is a continuation-in-part of application No. 15/242,508, filed on Aug. 20, 2016, now Pat. No. 10,315,220, which is a continuation-in-part of application No. PCT/US2015/015509, filed on Feb. 11, 2015, application No. 16/279,966, filed on Feb. 19, 2019, which is a continuation-in-part of application No. 16/173,922, which is a continuation-in-part of application No. 15/242,508, which is a continuation-in-part of application No. PCT/US2016/028185, filed on Feb. 11, 2015, said application No. 15/242,508 is a continuation-in-part of application No. PCT/US2016/028185, filed on Apr. 18, 2016, application No. 16/279,966, filed on Feb. 19, 2019, which is a continuation-in-part of application No. 16/173,922, which is a continuation of application No. PCT/US2017/029975, said application No. 16/173,922 is a continuation-in-part of application No. 15/242,508, which is a continuation-in-part of application No. PCT/US2015/015509, filed on Feb. 11, 2015, said application No. 16/173,922 is a continuation-in-part of application No. 15/242,508, which is a continuation-in-part of application No. PCT/US2016/028185, application No. 16/279,966, filed on Feb. 19, 2019, which is a continuation-in-part of application No. 16/173,922, which is a continuation of application No. PCT/US2017/029975, said application No. 16/173,922 is a continuation-in-part of application No. 15/242,508, which is a continuation-in-part of application No. PCT/US2015/015509, said application No. 16/173,922 is a continuation-in-part of application No. 15/242,508, which is a continuation-in-part of application No. PCT/US2016/028185, said application No. 16/173,922 is a continuation-in-part of application No. 15/242,508, application No. 16/279,966, filed on Feb. 19, 2019, which is a continuation-in-part of application No. 14/834,336, filed on Aug. 24, 2015, now Pat. No. 10,349,543, which is a continuation-in-part of application No. PCT/US2014/018096, filed on Feb. 24, 2014, application No. 16/279,966, filed on Feb. 19, 2019, which is a continuation-in-part of application No. 14/834,336, application No. 16/279,966, filed on Feb. 19, 2019, which is a continuation-in-part of application No. 15/073,436, filed on Mar. 17, 2016, now abandoned, which is a continuation of application No. PCT/US2014/056165, filed on Sep. 17, 2014, application No. 16/279,966, filed on Feb. 19, 2019, which is a continuation-in-part of application No. 15/073,436, which is a continuation-in-part of application No. 14/834,336, which is a continuation-in-part of application No. PCT/US2014/018096, application No. 16/279,966, filed on Feb. 19, 2019, which is a continuation-in-part of application No. 15/073,436, which is a continuation-in-part of application No. 14/834,336.

(60) Provisional application No. 62/381,492, filed on Aug. 30, 2016, provisional application No. 62/377,661, filed on Aug. 21, 2016, provisional application No. 62/377,511, filed on Aug. 19, 2016, provisional application No. 62/328,524, filed on Apr. 27, 2016, provisional application No. 62/289,147, filed on Jan. 29, 2016, provisional application No. 62/180,974, filed on Jun. 17, 2015, provisional application No. 62/148,732, filed on Apr. 16, 2015, provisional application No. 62/051,358, filed on Sep. 17, 2014, provisional application No. 62/051,355, filed on Sep. 17, 2014, provisional application No. 61/955,614, filed on Mar. 19, 2014, provisional application No. 61/938,613, filed on Feb. 11, 2014, provisional application No. 61/933,037, filed on Jan. 29, 2014, provisional application No. 61/933,027, filed on Jan. 29, 2014, provisional application No. 61/930,359, filed on Jan. 22, 2014, provisional application No. 61/930,370, filed on Jan. 22, 2014, provisional application No. 61/878,979, filed on Sep. 17, 2013, provisional application No. 61/821,495, filed on May 9, 2013, provisional application No. 61/788,698, filed on Mar. 15, 2013, provisional application No. 61/775,867, filed on Mar. 11, 2013, provisional application No. 61/775,852, filed on Mar. 11, 2013, provisional application No. 61/772,257, filed on Mar. 4, 2013, provisional application No. 61/772,239, filed on Mar. 4, 2013, provisional application No. 61/771,847, filed on Mar. 2, 2013, provisional application No. 61/768,494, filed on Feb. 24, 2013, provisional application No. 61/768,397, filed on Feb. 22, 2013.

(56) References Cited

U.S. PATENT DOCUMENTS

| | | | | |
|---|---|---|---|---|
| 7,523,546 | B2 | 4/2009 | Vatanaprast et al. | |
| 8,834,666 | B2 | 9/2014 | Sreetharan et al. | |
| 9,611,142 | B2* | 4/2017 | Hirata | G02B 26/0841 |
| 10,513,430 | B2* | 12/2019 | Uchino | B81C 1/00603 |
| 2002/0185713 | A1* | 12/2002 | Nakae | H01L 23/3107 257/666 |
| 2002/0192874 | A1* | 12/2002 | Schatzler | H01L 23/3107 438/124 |
| 2003/0076666 | A1* | 4/2003 | Daeche | H01L 21/4821 361/813 |
| 2004/0126911 | A1* | 7/2004 | Kimura | G02F 1/13624 438/22 |
| 2004/0128829 | A1* | 7/2004 | Kimura | H01L 21/6835 29/832 |
| 2006/0125042 | A1* | 6/2006 | Fuergut | H01L 23/3128 257/499 |
| 2008/0093424 | A1* | 4/2008 | Kumar | G01R 3/00 228/245 |
| 2008/0220308 | A1 | 9/2008 | Kanbe et al. | |
| 2008/0224301 | A1* | 9/2008 | Bauer | H01L 23/3107 257/698 |
| 2008/0277793 | A1* | 11/2008 | Noma | H01L 21/6835 257/758 |
| 2014/0353809 | A1* | 12/2014 | Shimizu | H01L 23/49513 257/676 |
| 2016/0200569 | A1* | 7/2016 | Hirata | G02B 26/0841 438/761 |
| 2016/0202473 | A1* | 7/2016 | Uchino | G02B 26/0841 359/221.2 |
| 2016/0372338 | A1* | 12/2016 | Liang | H01L 23/49575 |
| 2017/0209898 | A1* | 7/2017 | Henneken | B06B 1/0292 |
| 2019/0096758 | A1* | 3/2019 | Muri | H01L 21/561 |

* cited by examiner

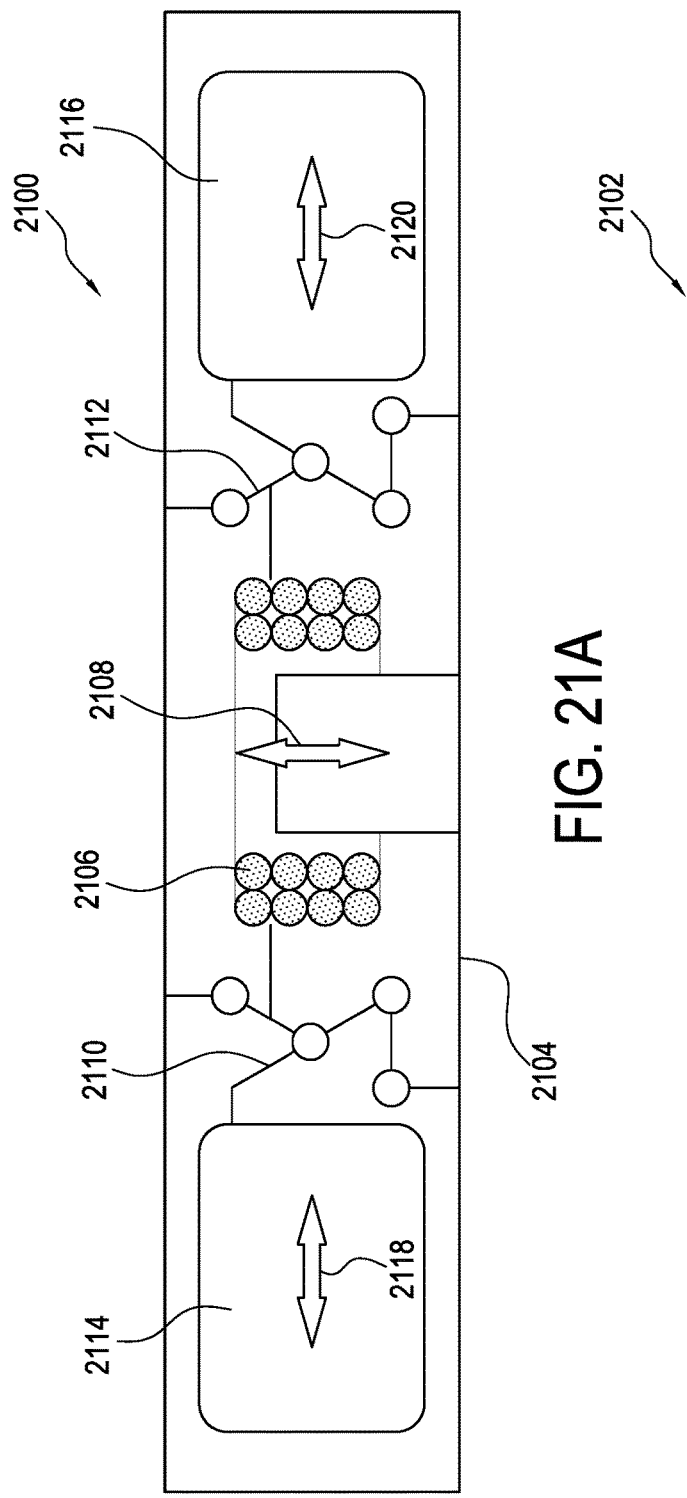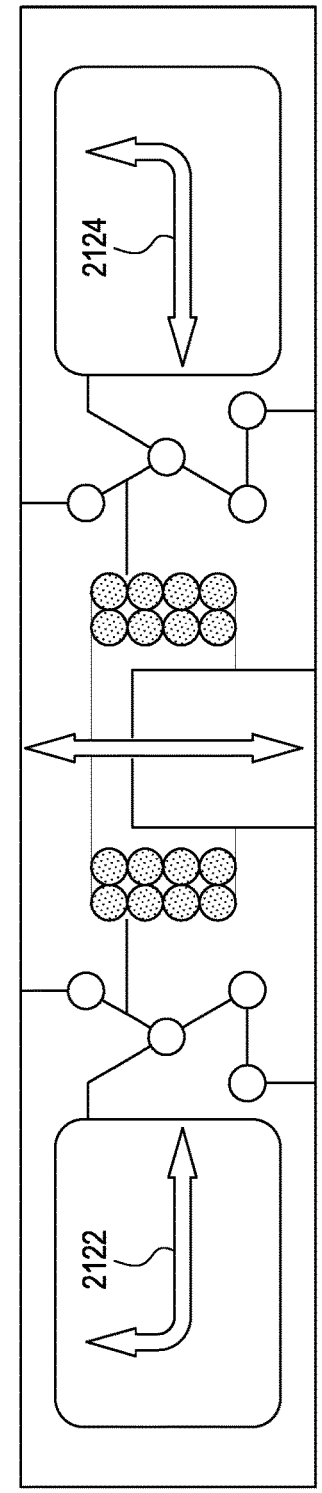

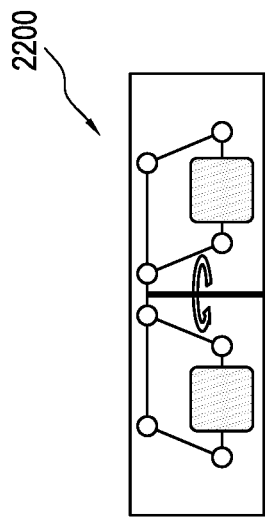
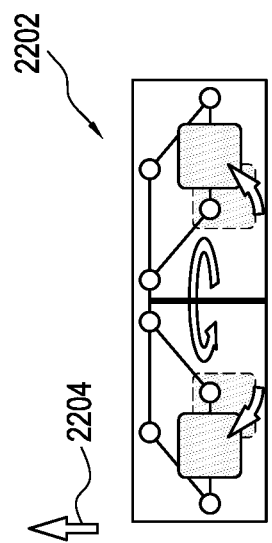
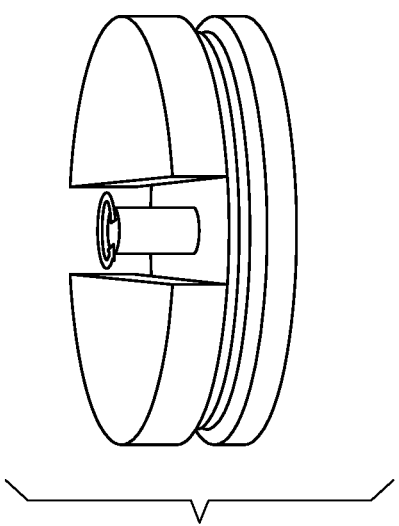
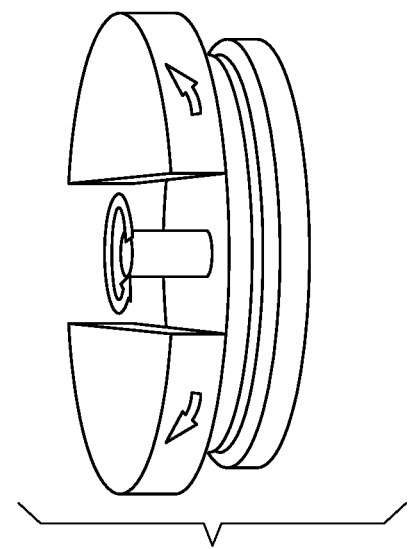
FIG. 22A
FIG. 22B

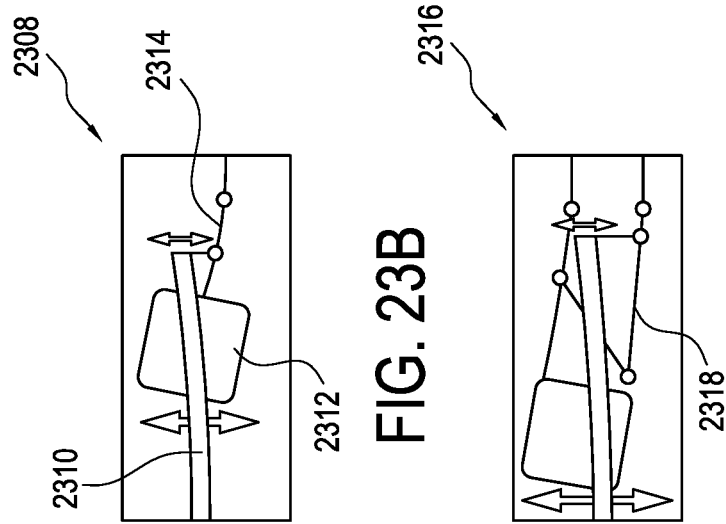
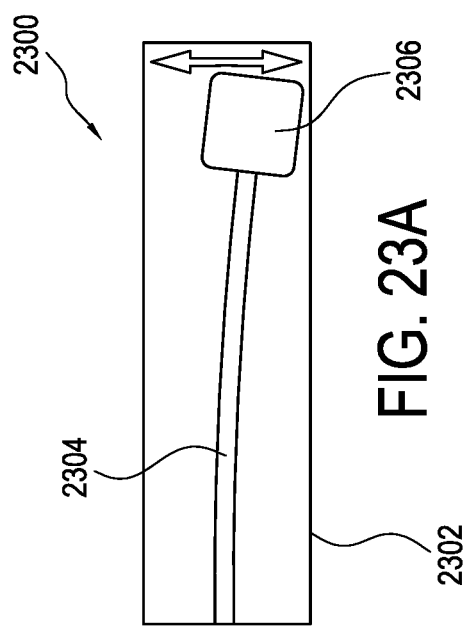

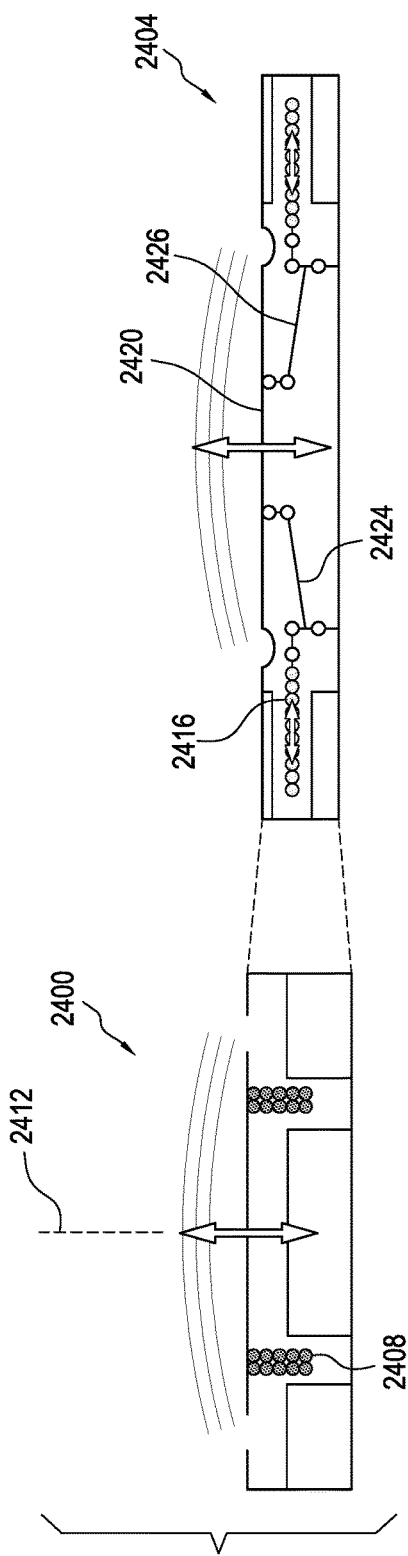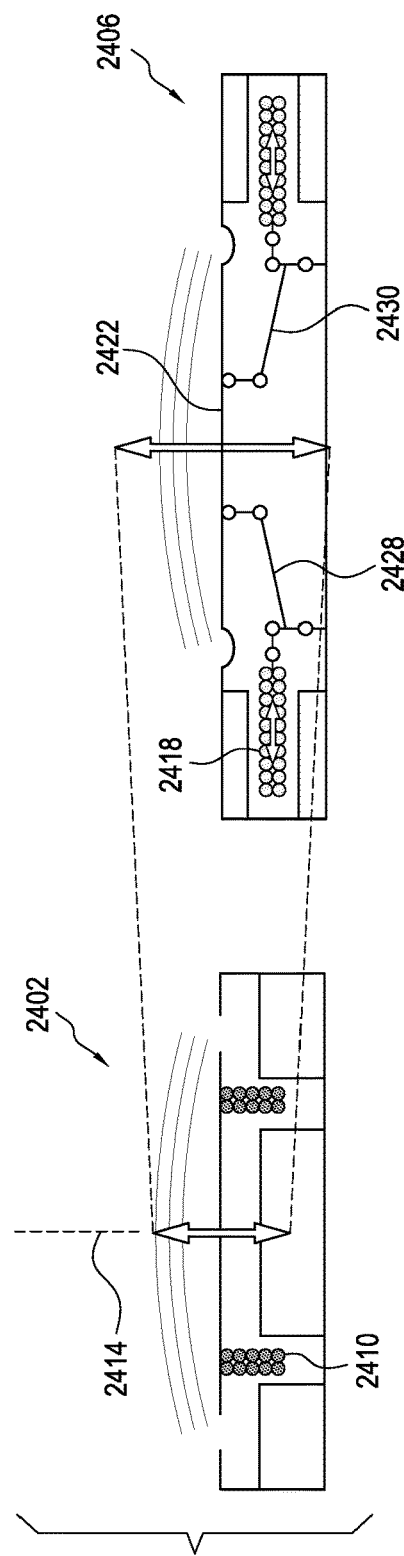
FIG. 24A
FIG. 24B

HIGH-VOLUME MILLIMETER SCALE MANUFACTURING

CROSS-REFERENCE TO RELATED APPLICATIONS

The present application is a U.S. Nonprovisional Application under 35 U.S.C. 111(a) of international application PCT/US2017/047869, having an international filing date of Aug. 21, 2017, and published as WO 2017/189928, which in turn claims the benefit of U.S. provisional patent application No. 62/377,511, filed on Aug. 19, 2016 and of U.S. provisional patent application No. 62/377,661, filed on Aug. 21, 2016 and of U.S. provisional patent application No. 62/381,492, filed on Aug. 30, 2016 the disclosures of all of the foregoing are incorporated in the present application by reference in their entirety. The present application is a continuation-in-part of U.S. patent application Ser. No. 16/173,922, filed on Oct. 29, 2018, which is a continuation of international application number PCT/US2017/029975, filed on Apr. 27, 2017, and published as WO 2017/189929 which in turn claims the benefit of U.S. provisional patent application No. 62/328,524, filed on Apr. 27, 2016 the disclosures of which are incorporated herein by reference in their entirety. The present application is a continuation-in-part of U.S. patent application Ser. No. 16/173,922, filed on Oct. 29, 2018, which in turn is a continuation-in-part of U.S. application Ser. No. 15/242,508, filed on Aug. 20, 2016, which in turn is a continuation-in-part of international application number PCT/US2015/015509, filed on Feb. 11, 2015, which claims benefit of U.S. provisional application No. 62/051,358, filed on Sep. 17, 2014 and claims benefit of U.S. provisional application No. 61/938,613, filed on Feb. 11, 2014 the disclosures of which are incorporated herein by reference in their entirety. The present application is a continuation-in-part of U.S. patent application Ser. No. 16/173,922, filed on Oct. 29, 2018, which in turn is a continuation-in-part of U.S. application Ser. No. 15/242,508, filed on Aug. 20, 2016, which in turn is a continuation-in-part of international application number PCT/US2016/028185, filed on Apr. 18, 2016, which claims benefit of U.S. provisional application No. 62/148,732, filed on Apr. 16, 2015 and claims benefit of U.S. provisional application No. 62/180,974, filed on Jun. 17, 2015 and claims benefit of U.S. provisional application No. 62/289,147, filed on Jan. 29, 2016 the disclosures of which are incorporated herein by reference in their entirety. The present application is a continuation-in-part of U.S. patent application Ser. No. 16/173,922, filed on Oct. 29, 2018, which in turn is a continuation-in-part of U.S. application Ser. No. 15/242,508, filed on Aug. 20, 2016, which claims benefit of U.S. provisional application No. 62/328,524, filed on Apr. 27, 2016 the disclosures of which are incorporated herein by reference in their entirety. The present application is a continuation-in-part of U.S. patent application Ser. No. 15/242,508, filed Aug. 20, 2016, which claims the benefit of U.S. provisional patent application No. 62/328,524, filed on Apr. 27, 2016, and which is a continuation-in-part of international application PCT/US2016/028185 filed on Apr. 18, 2016 which claims the benefit of U.S. provisional application No. 62/148,732, filed on Apr. 16, 2015 and of U.S. provisional application No. 62/180,974, filed on Jun. 17, 2015 and of 62/289,147, filed on Jan. 29, 2016, and which is a continuation-in-part of international application PCT/US2015/015509, filed on Feb. 11, 2015 which claims the benefit of U.S. provisional patent application No. 62/051,358, filed Sep. 17, 2014 and of U.S. provisional patent application No. 61/938,613, filed on Feb. 11, 2014 the disclosures of which are incorporated herein by reference in their entirety. The present application is a continuation-in-part of U.S. patent application Ser. No. 15/073,436 filed on Mar. 17, 2016 which is a continuation-in-part of U.S. nonprovisional application Ser. No. 14/834,336 filed on Aug. 24, 2015 which in turn claims benefit of U.S. provisional patent application No. 61/933,037, filed on Jan. 29, 2014 and U.S. provisional application No. 61/933,027, filed on Jan. 29, 2014 and of U.S. provisional application No. 62/051,355, filed on Sep. 17, 2014 the disclosures of which are incorporated herein by reference in their entirety. The present application is a continuation-in-part of U.S. patent application Ser. No. 15/073,436 filed on Mar. 17, 2016 which is a continuation-in-part of U.S. nonprovisional application Ser. No. 14/834,336 filed on Aug. 24, 2015 which in turn is a continuation-in-part of international application number PCT/US2014/018096, filed on Feb. 24, 2014 which in turn claims benefit of U.S. provisional application No. 61/768,397, Feb. 22, 2013 and of U.S. provisional application No. 61/768,494, filed on Feb. 24, 2013 and of U.S. provisional application No. 61/771,847, filed on Mar. 2, 2013 and of U.S. provisional application No. 61/772,239, filed on Mar. 4, 2013 and of U.S. provisional application No. 61/772,257, filed on Mar. 4, 2013 and of U.S. provisional application No. 61/775,852, filed on Mar. 11, 2013 and of U.S. provisional application No. 61/775,867, filed on Mar. 11, 2013 and of U.S. provisional application No. 61/788,698, filed on Mar. 15, 2013 and of U.S. provisional application No. 61/821,495, filed on May 9, 2013 the disclosures of which are incorporated herein by reference in their entirety. The present application is a continuation-in-part of U.S. patent application Ser. No. 15/073,436 filed on Mar. 17, 2016 which is a continuation of international application number PCT/US2014/056165, filed on Sep. 17, 2014 which in turn claims benefit of U.S. provisional application No. 61/878,979, filed on Sep. 17, 2013 and of U.S. provisional application No. 61/930,359, filed on Jan. 22, 2014 and of U.S. provisional application No. 61/930,370, filed on Jan. 22, 2014 and of U.S. provisional application No. 61/955,614, filed on Mar. 19, 2014 the disclosures of which are incorporated herein by reference in their entirety. The present application is a continuation-in-part of U.S. patent application Ser. No. 14/834,336 filed on Aug. 24, 2015 which claims the benefit of U.S. provisional patent application No. 62/051,355 filed on Sep. 17, 2014, and which is a continuation-in-part of international application PCT/US2014/018096 filed on Feb. 24, 2014 which claims benefit of U.S. provisional application 61/768,397, filed on Feb. 22, 2013 and of U.S. provisional application No. 61/768,494 filed on Feb. 24, 2013 and of U.S. provisional application No. 61/771,847, filed on Mar. 2, 2013 and of U.S. provisional application No. 61/772,239, filed on Mar. 4, 2013 and of U.S. provisional application No. 61/772,257 filed on Mar. 4, 2013 and of U.S. provisional application No. 61/775,852, filed on Mar. 11, 2013 and of U.S. provisional application No. 61/775,867, filed on Mar. 11, 2013 and of U.S. provisional application No. 61/788,698, filed on Mar. 15, 2013 and of U.S. provisional application No. 61/821,495, filed on May 9, 2013 and of U.S. provisional application No. 61/933,037, filed on Jan. 29, 2014 and of U.S. provisional application No. 61/933,027, filed on Jan. 29, 2014 the disclosures of which are incorporated herein by reference in their entirety.

FIELD OF THE INVENTION

The present invention relates to features of a manufactured assembly and more particularly to methods and assembly features of a manufactured laminated assembly.

SUMMARY

The ability to manufacture goods efficiently and with superior functionality has long been a key determinant of economic success for individuals, enterprises and societies. Contrary to popular perception, most innovation takes place through an evolutionary process in which pre-existing elements are recombined in surprisingly useful ways, rather than as a radical departure from the status quo. This is true of innovations in apparatus and methods and also in manufacturing techniques.

The history of manufactured goods spans a long series of transitions across materials (from wood, stone and leather to gold, copper, bronze, iron and steel and on to various synthetic materials including, among others, man-made polymers. Likewise, the techniques of manufacturing have evolved from the preparation of individual items through the development of interchangeable parts, moving assembly lines and various photolithographic techniques for the preparation of circuit boards, integrated circuits and micro-electromechanical (MEMS) systems.

MEMS systems predominate among mechanical devices at the micron scale and typically involve the bulk addition and removal of materials in serial fashion from a single substantially planar substrate. Traditional machining and fabrication practices are readily applicable to devices from centimeter scale up to meters (e.g. large machine tools and dynamos).

While these developments have led to a remarkable abundance and variety of products, one that would astound the most prescient individual of a century ago, there remain apparatus and systems that are persistently difficult, time-consuming and consequently expensive to manufacture. In particular, manufacturing at the millimeter scale, remains challenging for a variety of reasons.

The inventors of the present invention has conceived and implement and a fundamental advancement in manufacturing technology at this millimeter scale. As described, for example, in PCT patent application number PCT/US 2014/018096 (WO2014130967) (the disclosure which is herewith incorporated by reference in its entirety) the present inventors have created a useful and fundamentally novel manufacturing technique (as exemplified in numerous devices) that readily allows mass production of millimeter scale mechanical, electromechanical, pneumatic and hydraulic devices, among others, at high volume and low cost and demonstrating robustness and effectiveness unmatched by other technologies in the prior art.

This new technology and method includes the assembly of more or less flexible and more or less rigid layered materials in a generally two-dimensional format and, thereafter, activating these assemblies to achieve operative systems with multiple degrees of freedom and, in many cases, a generally three-dimensional aspect. This groundbreaking technology is termed μMECS™.

Now, having achieved still further advancements, and thereby achieving surprising and unexpected results, beneficial to the technology broadly, and to the numerous and various disciplines that it improves and enables, the inventors herewith present systems, methods and apparatus related to high-volume manufacturing at the millimeter scale.

The methods presented here enable high volume, low cost fabrication of μMECS™ components. These processes represent significant improvements to throughput and cost over state of the art prototype methods, enabling μMECS™ components for high volume consumer markets.

Throughout this work a reference component, the Thumper™ Haptic Communicator (THC), is used to quantify process improvements for a component targeting high volume consumer markets. A preferred embodiment of THC fabrication at high volumes follows the detailed description of inventions. A summary of key innovations that enable high volume μMECS component manufacturing include:

- Use of a printable/patternable rapid curing adhesive for multilayer lamination and component assembly. Rapid cure mechanisms include pressure sensitive adhesives (PSA), light curing (UV/visible), delayed light cure, and thermal snapcure adhesives with setting/cure times <5 minutes. A reduction in lamination cycle time from 5 hours to <1 minute is possible.
- Use of a high throughput, batch adhesive patterning process based on die cutting, screen/stencil printing, jetting, pad printing, or photo-patterning. To fabricate THC using state of the art UV laser machining requires 30 minutes per part. Batch processes can pattern an entire panel in seconds per adhesive layer.
- Use of mask-less adhesive printing processes to assemble linkage and spacer sub-laminates. In many cases, linkages and spacers do not require independent adhesive patterning; the adhesive pattern matches that of an adjoining ply. In this scenario, the material ply can be used as a mask to define the adhesive pattern in continuous or batch processes. Example processes include ultrasonic spray (deposit adhesive in seconds per ply) and selective wet/dry etching (remove adhesive in minutes per batch).
- Use of printed flex circuits as linkage laminate and spacers. Examples include using double-sided stainless steel flex circuits or fine line copper circuits as linkage laminates. Fabrication steps are analogous to those employed in the manufacture of flexible Printed Circuit Board (PCB) (e.g. photolithography and wet etch features). This method enables high throughput linkage and spacer fabrication with existing PCB manufacturing lines. An additional benefit is bridge-less rigid plies; stainless steel can be patterned with material islands, retained to webbing by flex material, improving throughput and capital equipment cost. (Mylar™ polyester).
- Use of a rapidly machinable carrier for substrate transport. This method enables direct patterning of islands of material in μMECS plies, unsupported by bridges (but supported by carrier). The aim of this method is to simplify release processing; by patterning rigid structural plies (e.g. stainless steel) without bridges, release is carried out on thin, easily machined plastic films. Example carriers include a thin film, rapidly machinable substrate (e.g. Polyimide, Polyester) or soluble film that can be dissolved after lamination (e.g. Polyvinyl Alcohol). In the case of linkage laminates the flex ply can double as a carrier film, further simplifying processing.

Having examined and understood a range of previously available devices, the inventors of the present invention has developed a new and important understanding of the problems associated with the prior art and, out of this novel understanding, has developed new and useful solutions and improved devices, including solutions and devices yielding surprising and beneficial results.

Certain exemplary structures, prepared according to principles of the invention, will include laminated structures created from substantially flat source layers of material. Three-dimensional assemblies are formed through subtractive machining and additive lamination of these flat layers. Such a methodology creates two and a half dimensional structures built from the layers. In addition, certain three-dimensional structures will be added to the assembly for their beneficial effect.

For example, The micro-Multilayer Etched Composite Systems (µMECS™) process is used to manufacture low profile electromechanical systems. Generally, µMECS components consist of linkage mechanisms fabricated by layering sheets of patterned, rigid and flexible materials. The simplest embodiment of a µMECS component, a flexible hinge ('flexure'), consists of two rigid links connected by a compliant bending beam. The flexure approximates the motion of a pin joint by elastically deforming under applied loads. Flexures exist at many scales, however the µMECS process enables very small (0.1 millimeter to 10 centimeter) hinges.

The unit flexure hinge can be fabricated using the generic process described below (See FIG. 1). Previously, methods have been described for preparing µMECS™ systems at prototype manufacturing volumes.

The invention encompassing these new and useful solutions and improved devices is described below in its various aspects with reference to several exemplary embodiments including a preferred embodiment.

These and other advantages and features of the invention will be more readily understood in relation to the following detailed description of the invention, which is provided in conjunction with the accompanying drawings. It should be noted that, while the various figures of the following drawings show respective aspects of the invention, no one figure is intended to show the entire invention. Rather, the figures together illustrate the invention in its various aspects and principles. As such, it should not be presumed that any particular figure is exclusively related to a discrete aspect or species of the invention. To the contrary, one of skill in the art will appreciate that the figures taken together reflect various embodiments exemplifying the invention.

Correspondingly, referenced throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

In the interests of clarity, the following definitions are provided:

Flexure: A hinge comprised of a compliant material that elastically deforms, approximating the motion of a pin joint.

Substrate: In the context of µMECS™ component, substrate refers to material that provides function and is retained within a µMECS™ component.

Chip: In contrast to substrate, chips are present during fabrication but are sacrificial and released from the final µMECS™ component.

Bridge: In the context of µMECS™, bridges retain substrate material to surrounding webbing during processing. Bridges are released to free the µMECS™ component degrees of freedom.

Release: The act of freeing substrate and chip from surrounding webbing, usually by breaking bridges. Partial, or intermediate release refers to bridge removal prior to freeing the final part from webbing (singulation).

Plies: Individual material layers in a µMECS™ laminate composite.

Lamination: Substantially permanent bonding of µMECS™ plies. Usually lamination occurs under heat and/or pressure to cure an adhesive.

Sub-laminate: A laminate that is not a final µMECS™ product, but will be subsequently bonded to additional plies to form the final laminate.

Linkage: Laminate A laminate or sub-laminate that contains flexure hinges and rigid links.

Spacer: Generically, spacers are any plies within a 1zMECS laminate that do not contain flexures and are not adhesive. Spacers can serve many functions but three examples are: rigid mechanical ground, to set a distance between two linkage laminates (i.e. as part of the rigid links within a traditional kinematic linkage), or kinematic mounts for sub-components.

Adhesive Plies: Adhesive plies within a µMECS™ laminate generically describe adhesive connecting linkages and spacers. Adhesive is typically uniquely patterned for selective adhesion between sub-laminates, and is therefore considered a ply; this is not typical within standard composites manufacturing.

The following description is provided to enable any person skilled in the art to make and use the disclosed inventions and sets forth the best modes presently contemplated by the inventors of carrying out their inventions. In the following description, for purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the substance disclosed. These and other advantages and features of the invention will be more readily understood in relation to the following detailed description of the invention, which is provided in conjunction with the accompanying drawings.

It should be noted that, while the various figures show respective aspects of the invention, no one figure is intended to show the entire invention. Rather, the figures together illustrate the invention in its various aspects and principles. As such, it should not be presumed that any particular figure is exclusively related to a discrete aspect or species of the invention. To the contrary, one of skill in the art would appreciate that the figures taken together reflect various embodiments exemplifying the invention.

Correspondingly, referenced throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

BRIEF DESCRIPTION OF THE DRAWINGS

FIGS. 21A-21B illustrate, in schematic cross-section, respective operational states of an electro-mechanical device prepared by a method according to principles of the invention;

FIGS. 22A-22B illustrate, in schematic cross-section and schematic perspective view, respective operational states of another electro-mechanical device prepared by a method according to principles of the invention;

FIG. 23A illustrates, in schematic cross-section, respective operational states of a substantially conventional mechanical device;

FIGS. 23B-23C illustrate, in schematic cross-section, respective embodiments of electro-mechanical devices prepared by a method according to principles of the invention;

FIGS. 24A and 24B illustrate, in schematic cross-section, respective operational states of substantially conventional devices and contrasting electro-mechanical devices prepared by a method according to principles of the invention;

DETAILED DESCRIPTION

The following description is provided to enable any person skilled in the art to make and use the disclosed inventions and sets forth the best modes presently contemplated by the inventors of carrying out their inventions. In the following description, for purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the substance disclosed.

Figure 1:
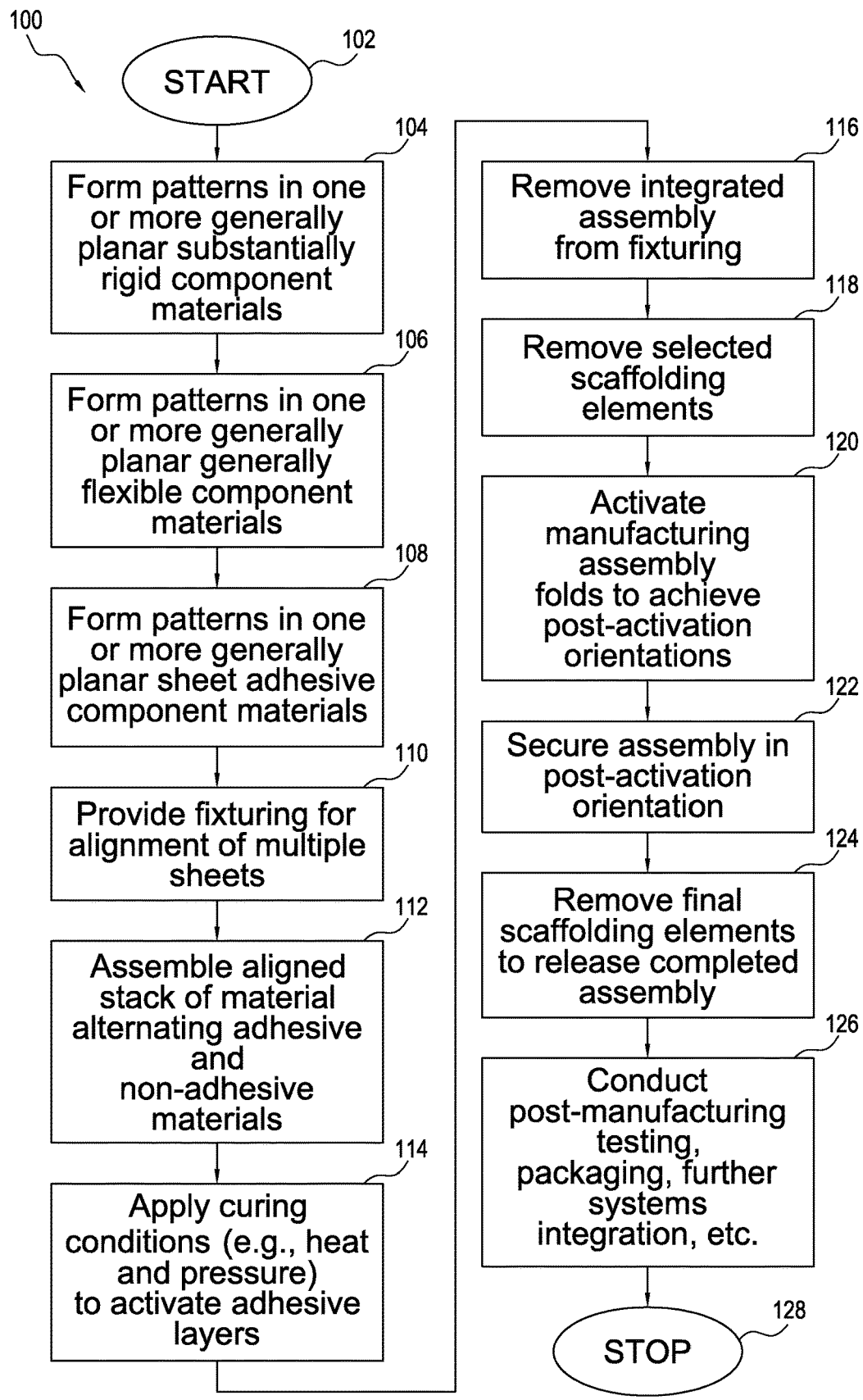
FIG. 1 shows, in flowchart form, certain aspects of a prototype scale process according to principles of the invention.

FIG. 1 shows a block diagram corresponding to certain steps of a generalized manufacturing process 100 for manufacturing a µMECS™ device. Beginning at step 102, the process involves forming a pattern in one or more generally planar sheets of a more or less rigid material. In a typical application, at least one of the sheets will be substantially rigid. In certain applications, the generally rigid material may have an anisotropic characteristic such that it is more or less rigid along one axis than along another.

In various applications, the sheet will include a material such as, for example, fiberglass reinforced polyester, carbon reinforced polyester, or any other filled or reinforced polymer material. Alternately or in combination, the generally rigid material may include a metallic material such any appropriate metal or metallic alloy. The forming of a pattern in such a sheet of material will include, in certain exemplary applications, the removal of material by photolithographic etching, the removal of material by laser machining, patterning of the material by the application of a die and/or the removal of material by the application of a cutting tool. In addition, additive processes may be used in forming the patterned sheet.

At step 104, a pattern is formed in one or more sheets of a generally planar flexible component material. In various applications, the generally flexible material may be substantially flexible. In certain applications, the flexible material may have an anisotropic characteristic such that it is more or less flexible along one axis than along another. Patterning of the generally flexible material will proceed in any manner appropriate to the material including, among others, any of the processes identified above with respect to the rigid material.

At step 106, a pattern is formed in one or more sheets of an adhesive component material. In various cases, the adhesive material may be substantially flexible. In other cases, the adhesive material will be substantially rigid. In certain cases, the adhesive material may have an anisotropic characteristic such that it is more or less flexible or rigid along one axis than along another. Patterning of the adhesive material will proceed in any manner appropriate to the adhesive material including, among others, any of the processes identified above with respect to the rigid and flexible materials.

As indicated at step 110, fixturing apparatus is provided for alignment of the various sheets of rigid, flexible and adhesive material prepared in steps 104-108. In certain embodiments, the fixturing apparatus will include alignment pins such as are known in the art. In other embodiments the fixturing apparatus will include active alignment actuators and/or optical alignment devices.

As indicated in step 112, an assembly is thereafter prepared by applying the previously prepared and patterned (and in some cases unpatterned sheets of material) to the fixturing apparatus. It will be appreciated that the patterns and materials will, in certain embodiments, differ from sheet to sheet according to the requirements of a particular application. Moreover, in certain cases, one or more sheets of adhesive material may be omitted in favor of applying adhesive individual sheets and/or surface regions. The adhesive material will be applied, in any manner that is, or becomes, known in the art. By way of example only, the adhesive material may be applied in liquid, powder, aerosol or gaseous form as individual sheets are added to the assembly.

As will be understood by one of ordinary skill in the art in light of the totality of the current presentation, the characteristics of the various layers and patterns will be chosen and applied according to the requirements of a particular assembly being prepared. Thus, for example, where a joint feature is required, a prepared void in substantially rigid sheets above and below a flexible layer will leave a portion of an intervening flexible layer exposed and ultimately able to flexibly support the adjacent more rigid materials.

As indicated in step 114, curing conditions are then applied to the assembled materials and/or fixturing apparatus. In certain embodiments, the curing conditions will include the application of heat and/or pressure to the assembly of layers. In other embodiments, the curing conditions will include the application of physical or chemical additives such as, for example, catalytic chemicals, reduce temperatures, gaseous chemical components, or any other condition appropriate to secure a desirable unification of the various layers into an integrated assembly.

As per step 116, the integrated assembly is, in certain embodiments, then removed from the fixturing apparatus. In some embodiments the integrated assembly is transferred thereafter to additional fixturing equipment. In other embodiments, and as will be understood by one of skill in the art, the integrated assembly remains on the fixturing apparatus for further processing.

In step 118, a method according to certain embodiments of the invention will include the removal of certain portions of one or more of the rigid and/or flexible layers. These portions will have served to support particular regions of the corresponding layer during the preceding processing steps. Their removal will allow one or more of those portions to translate, rotate, or otherwise reorient with respect to some additional portion of the assembly. This step may include the removal of individual assemblies from a larger sheet/assembly on which multiple assemblies of similar or different configurations have been prepared.

In certain embodiments, the removal of particular support regions will be effected by laser machining. In various other embodiments, the removal of support regions will be effected by mechanical machining, wet chemical etching, chemical vapor etching, scribing, cutting, die cutting, punching, and/or tearing, among others. One of skill in the art will appreciate that any combination of these methods (or other methods that are known or become known in the art) will be beneficially applied and will fall within the scope of the invention.

Once the removal of identified portions of the one or more rigid and/or flexible layers is complete, the assembly is activated, as per step 120 to transition from its existing status to a post-activation configuration. This activation will, in certain embodiments, include reorientation of certain portions of one or more regions of one or more of the sheets of material. Thus, for example, in certain embodiments, a portion of the assembly will fold up out of its initial plane to form a three-dimensional assembly in the manner of a pop-up book.

The activation 120 will incorporate various motions in corresponding embodiments of the invention including various translations and rotations along and about one or more axes. In respective embodiments, the activation will be effected by active fixturing apparatus, by the action of an individual worker, by a robotic device, by a device integrated within the assembly itself such as, for example, a spring, a motor, a piezoelectric actuator, a bimetal/bimorph device, a magnetic actuator, electromagnetic actuator, a thermal expansive or contractive device, a chemical reaction including, for example, a gas generating process, a crystallization process, a dehydration process, a polymerization process, or any other processor device appropriate to the requirements of a particular application.

In certain embodiments, and as indicated at step 122, a further process step will secure the apparatus in its activated configuration. Among other methods that will be evident to one of skill in the art in light of the present disclosure, this step of securing the apparatus in its activated configuration will include, in certain embodiments, point soldering, wave soldering, tip soldering, wire bonding, electrical welding, laser welding, ultrasonic welding, thermal bonding, chemical adhesive bonding, the activation of a ratchet and pawl device, the activation of a helical unidirectional gripping device, the application of a snap, a hook and loop fastener, a rivet, or any other fastener or fastening method that is known or becomes known to those of skill in the art.

Of course it will be understood by the reader that in certain embodiments, the process or mechanism that reorients the apparatus into its activated configuration will serve to maintain that configuration without any additional step 122 process or action. Moreover, while the securing indicated at step 122 is generally anticipated to be permanent, in certain applications it will be beneficially temporary and/or repeatable.

At step 124 additional scaffolding elements will be removed or severed to release the activated and secured µMECS™ device from any remaining scaffolding. One of skill in the art will appreciate that this step will be unnecessary where the device was completely released from any associated scaffolding prior to activation. Moreover, in other embodiments and applications the activated device will remain coupled to surrounding scaffolding for additional processing steps. To the extent that step 124 is applied any of the approaches and methodologies identified above at, for example, step 118 will be advantageously applied according to the instant circumstances.

Thereafter, again depending on the requirements of a particular apparatus or embodiment, various testing, packaging, systems integration and other manufacturing or application steps will be applied as indicated in step 126 after which the operation concludes with step 128.

Figure 2A:
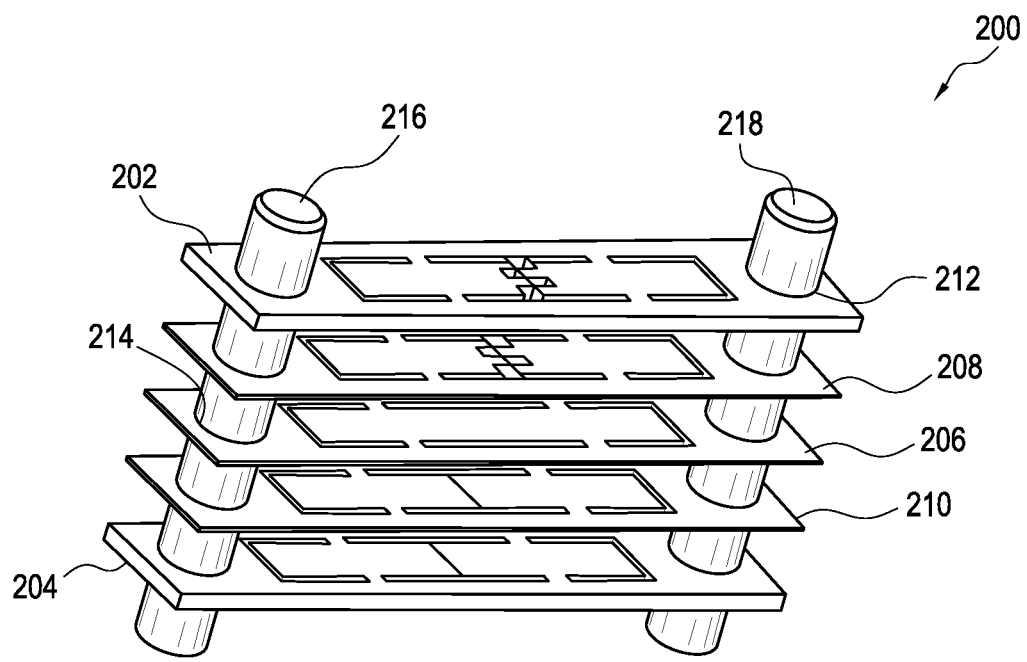
FIG. 2A shows, in schematic perspective view elements of a device prepared according to principles of the invention in an un-laminated state.

FIG. 2A shows certain elements 200 of an assembly consistent with, for example, process 100. The elements include a first patterned substantially rigid layer 202, a second patterned substantially rigid layer 204, a patterned substantially flexible layer 206, and first 208 and second 210 patterned adhesive layers.

As shown, the pattern of each exemplary layer includes apertures, e.g., 212, 214 for receiving corresponding fixturing pins or dowels, e.g., 216, 218. These fixturing dowels serve to maintain a desirable alignment of the various patterns while the assembly is compressed and curing of the adhesive layers 208, 210 is accomplished.

Figure 2B:
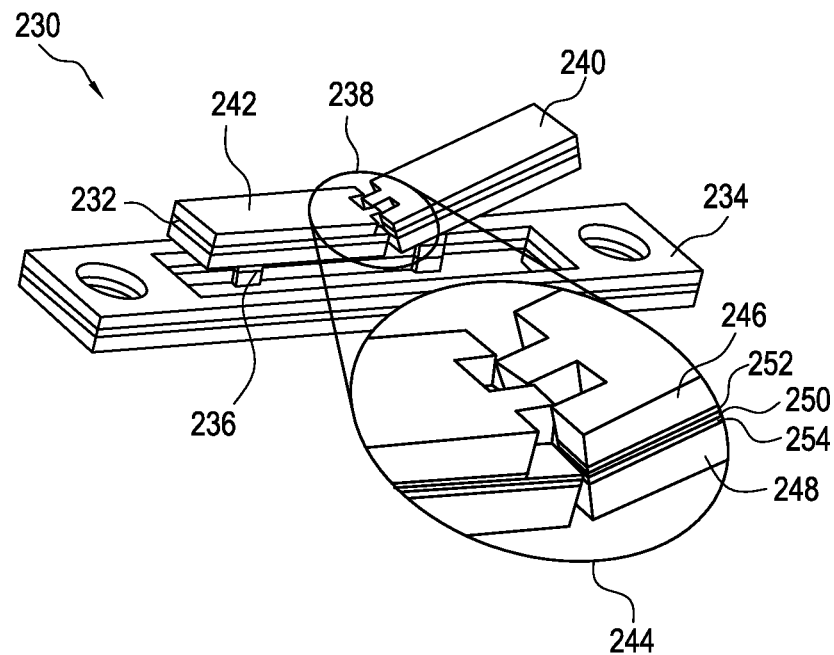
FIG. 2B shows, in schematic perspective view, a device similar to that of FIG. 2A in a completed state.

The result, as shown 230 in FIG. 2B is an exemplary hinged assembly 232 that has been released from a surrounding scaffolding material 234 by the severing of various support regions, e.g., 236. As is readily apparent the released assembly includes a hinge feature 238 coupled between first 240 and second 242 substantially rigid members. As further shown in the magnified portion region 244, each substantially rigid member includes an upper rigid portion 246 and a lower rigid portion 248 coupled to respective sides of the flexible portion 250 by respective layers of cured, or otherwise activated, adhesive material 252, 254. It will be further appreciated that, while no securing step is apparent in relation to the hinged assembly 232, other assemblies will benefit from such further processing.

According to principles of the present invention, µMECS components can be fabricated in-line, one component at a time, or in batches. When using parallel processes (e.g. etching), manufacturers should fit as many components as possible onto a single panel to minimize unit cost and improve throughput. For example, 600×600 or 1200×1200 are used in low volume production, however panel size should be chosen based on equipment capabilities, throughput, and required tolerances.

Figure 3A:
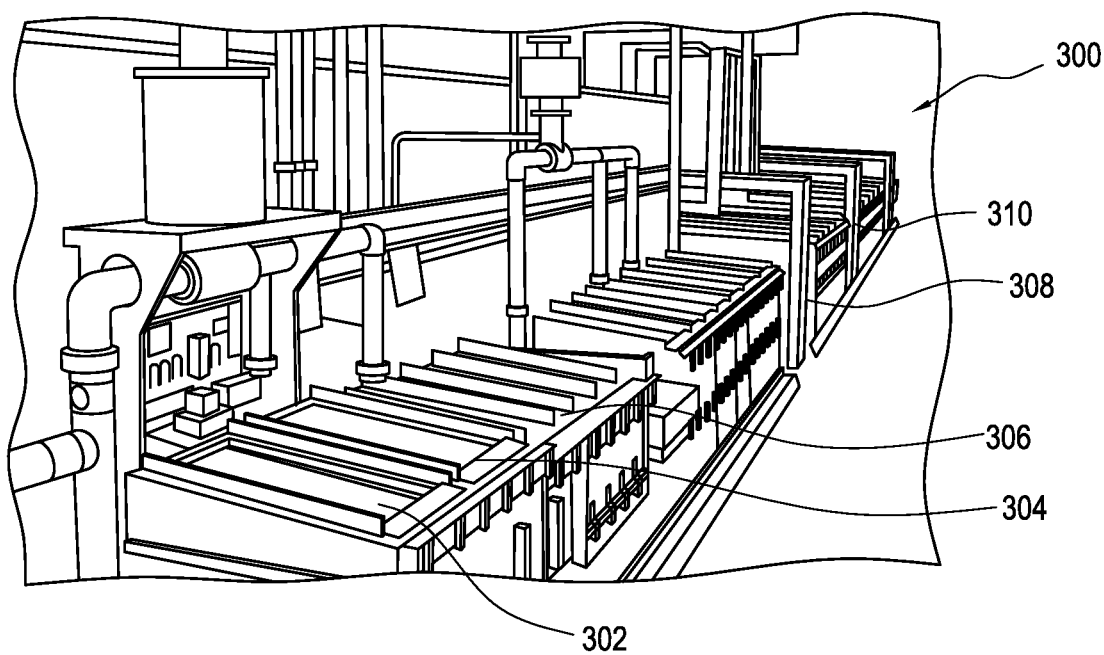
FIG. 3A shows a printed circuit manufacturing line illustrative of equipment that will optionally be employed in practicing certain aspects of the present invention.

FIG. 3A shows, for example, an automated vertical wet processing system 300 for the processing of printed circuit boards. The system includes a plurality of individual chemical processing and rinse tanks, e.g., 302, 304, 306. Robotic equipment, e.g. 308, 310 can be applied to move substrate materials and subassemblies between the various processing and rinse tanks to effect desired etching steps, such as those further described below. Typically, the work in process materials will be temporarily coupled to machine racks that are effective to readily interface with the robotic equipment 308, 310 and suspend the work in process material within the tanks.

Figure 3B:
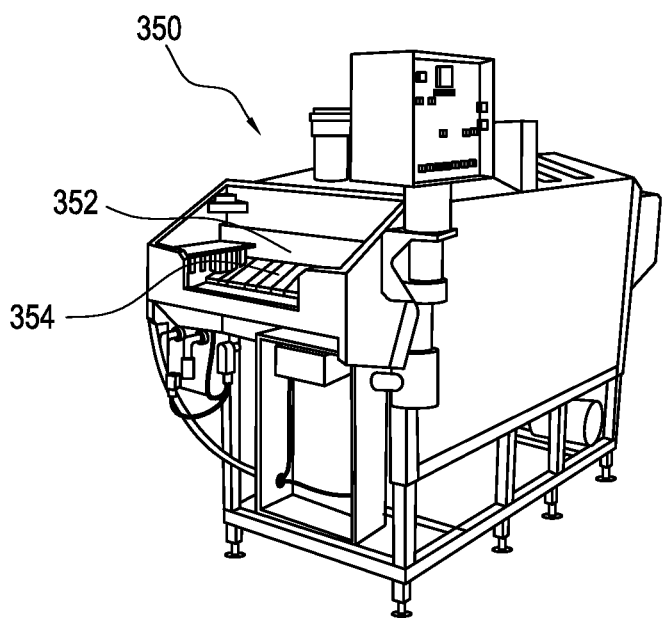
FIG. 3B shows a horizontal conveyorized printed circuit manufacturing station illustrative of certain equipment that will optionally be employed in practicing certain aspects of the present invention.

FIG. 3B shows an alternative style of processing equipment 350 in which work in process materials are conveyed through a processing chamber 352 while supported from below by a conveyor belt 354. Processing chemicals and rinses are applied by, e.g., spraying from above as the work in process material passes through a series of such stations. Again the work in process will, in particular embodiments of the invention, include individual plies of µMECS™ material and/or multi-layer subassemblies.

Figure 4A:
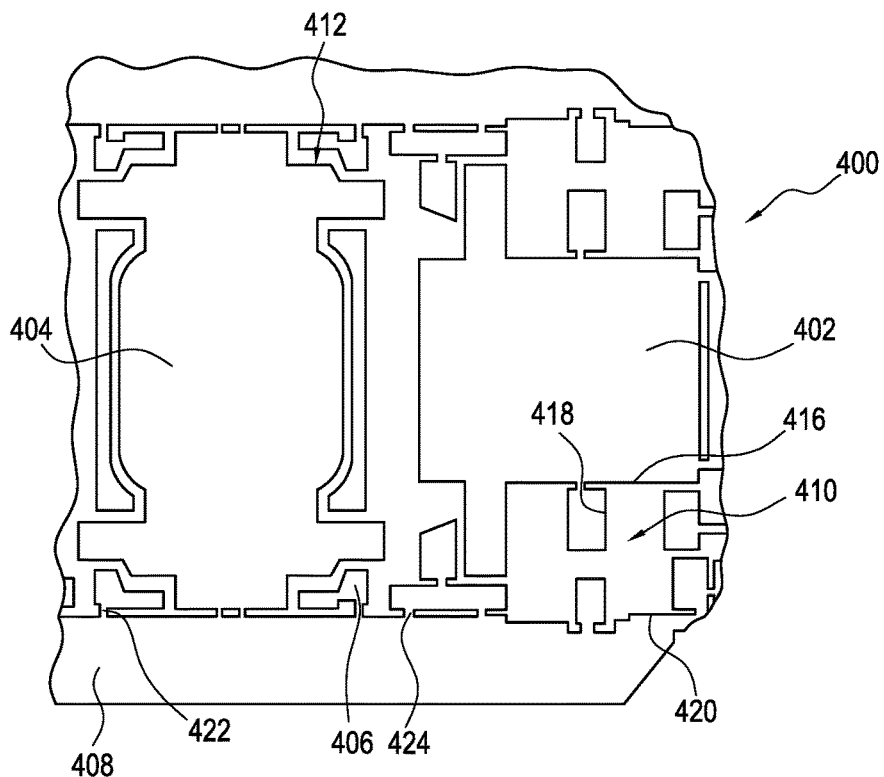
FIG. 4A shows, in schematic plan view, a portion of a layer or ply prepared to be included in a device prepared according to principles of the invention.

FIG. 4A illustrates, in schematic plan view, a portion of a µMECS™ component ply 400 prepared according to principles of the invention. In certain embodiments, the ply 400 will include a material such as, for example, a stainless steel material, a spring steel material, a metallic alloy material, or any other material desirable in a particular application of the invention.

After etching in any high-volume process of the current invention, the ply will include land areas, e.g. 402, 404, 406 and scaffolding regions 408. Apertures, e.g. 410, 412 are defined by respective edges of the land areas, e.g. 416, 418, 420.

In certain embodiments of the invention, bridge material, e.g. 422, 424 will be temporarily left in place between respective land areas and/or land areas and scaffolding regions. It will be appreciated by one of skill in the art, that these bridge materials will be removed during later processing. As will be further described below, in other embodiments of the invention, the desired ply material 400 will be pre-laminated with a sacrificial layer of, for example, a polymer material. Consequently, no bridge material will be left in place. Instead, the sacrificial layer will be, e.g., dissolved, evaporated or burned away during later processing.

It will be understood that the application of automated vertical and horizontal chemical processing, according to principles of the invention, will allow the production of high-quality layers and subassemblies at substantially higher throughputs and, ultimately, lower per part cost as compared with laser etching. The resulting economic efficiencies will allow the application of µMECS™ manufacturing techniques to produce wide variety of consumer and industrial components and devices.

Adhesive patterning and cure time are the primary targets for increased µMECS production throughput. As a high throughput alternative to laser-cutting B-staged film, adhesive can be patterned during deposition on plies or sublaminates. Various high volume adhesive deposition methods are described below: Screen/Stencil Printing As demonstrated in electronics assembly, adhesives of many cure types (e.g. light, thermal, PSA) can be screen/stencil printed. Generally, screen printable adhesives are high viscosity and thixotropic liquids or pastes. Screen/stencil printing is successfully implemented in precision, high volume applications such as flip chip packaging, die attach, solar cells, and MEMS packaging with demonstrated trace and space down to 101 Lm/101 Lm.

A fine stainless steel mesh >325 with thin emulsion can achieve fine line, thin bond line (<1 mil) results. For high throughput µMECS, automated screen printers used in electronics assembly can coat each panel in seconds in an automated assembly line. Example adhesives for thin bond line, fine line screen printing include DUALBOND OB787 (DELO), H70 line of epoxies (Epoxy Technol-ogy), and Ablebond 8387 (Henkel). For liquid and paste adhesives, bond line can be difficult to control in a laminate.

According to principles of the invention, high-volume production can be achieved in part by the application of adhesive patterning technologies including adhesive jet printing, diecut adhesive film, adhesive transfer printing, adhesive spraying, and the application of adhesive B-staging along with any of these technologies.

Adhesive patterns can be printed using high speed jet dispensing, for example ink jet. Example hardware is the Nordson ASYMTEK DispenseJet DJ-9500 or DELO-DOT PN2, capable of dispensing adhesive down to 150l Lm dots at 300 Hz. Complex adhesive geometries with thin bond line can be achieved by depositing dot patterns with predictable flow when compressed. Bond line can be maintained using the Bond Line Control processes below.

A common technique for substrate die attach, B-staged epoxy or acrylic adhesives are die-cut from adhesive carrier and placed at precise locations onto a substrate. Die cutting is a possible application for μMECS components with adhesive patterns containing simple, repeatable shapes. Die cutting can be combined with higher precision methods (e.g. laser machining) to achieve high throughput and small features. An example adhesive film is ESP7670-WL (AI Technology Inc.), which is thermally cured in, for example, under 10 minutes.

Transfer printing employs an etched or engraved plate to pick up and transfer a pattern of adhesive to substrate. Processes to transfer adhesive patterns to μMECS™ plies include rotogravure, flexographic printing, stamping, pad printing, or any other process to physically transfer a pattern of liquid adhesive to a ply.

Spraying is a further process for rapid deposition of thin adhesive coats on patterned plies. In general, spraying is used to coat an entire ply with adhesive in under 5 seconds. A variety of liquid adhesives can be sprayed (e.g. epoxies or acrylics), including B-stageable materials.

Figure 4B:
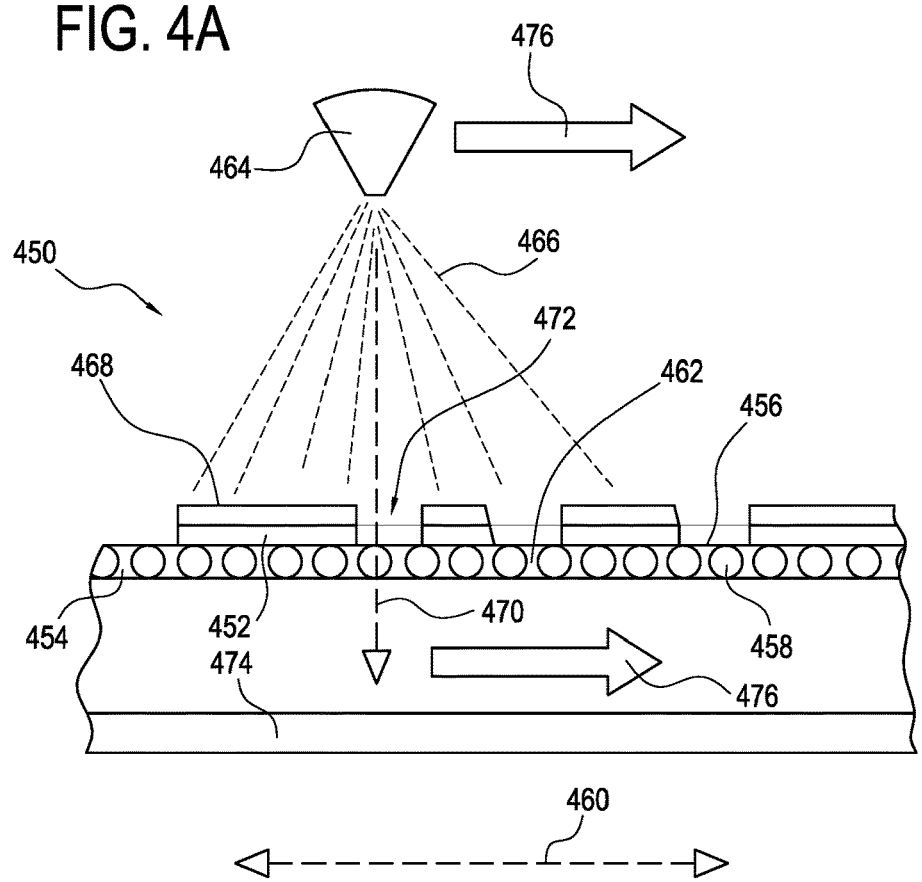
FIG. 4B shows, in schematic side view, certain aspects of a manufacturing process and manufacturing equipment according to principles of the invention.

FIG. 4B illustrates, in schematic elevation, the application of an exemplary spray deposition process 450 according to principles of the invention. As shown, a previously etched component ply 452 is supported for processing on, for example, a conveyor or table 454. In certain embodiments, and as illustrated, the conveyor or table 454 will include a screen or textile material having members arranged longitudinally, e.g. 456 and transversely 458 to a longitudinal axis 460 of a processing station. In this arrangement, apertures 462 are present between the textile members. A spray nozzle 464 is disposed, for example, above the component ply 452.

As illustrated, uncured adhesive material 466 is sprayed towards and onto the component ply 452. The adhesive material 466 will self pattern on the component ply 452, forming a layer of adhesive 468 on the land areas of the component ply and passing through 470 apertures 472 of the component ply 452. The resulting layer of adhesive 468 may thereafter be immediately placed in contact with further component plies, be allowed to dry by evaporation of a solvent and/or be B-cured for later processing.

Excess adhesive material 466, 470 having passed through apertures 472 of the component ply, 472 is collected 474 for disposal and/or recirculation.

In certain embodiments of the invention, the conveyor or table 454 will advance 476 to move the component ply material 452 past the spray nozzle 464 to ensure distribution of the adhesive material in an even layer 468 on the component ply 452. In other embodiments of the invention, the spray nozzle 464 will be mobile, and moved 478 to achieve this end. In certain other embodiments of the invention, both the spray nozzle 464 and the conveyor or table 454 will move.

It will be appreciated by one of skill in the art that multiple spray nozzles will, in certain embodiments, be employed in parallel and, that in certain embodiments multi-component adhesives will be sprayed through a single nozzle and/or through discrete respective nozzles. In addition, in certain embodiments, inkjet spray nozzles will be employed such that rastering of the spray nozzle and/or the supporting conveyor or table will allow specific patterning of the adhesive layer 468.

Selective adhesion can be achieved using a physical shadow mask registered to a machined ply. Masks are not required for linkage or spacer laminate plies when adhesive pattern is identical to adjoined ply. In this case, the ply acts as a mask by collecting only on its surface with minimal deposition on sidewall or across holes. Exemplary results are obtained by depositing 3-25 μm B-stageable epoxy using an ultrasonic sprayer (e.g., Ultrasonic Systems Inc.) on steel and polyimide substrates.

Figure 5:
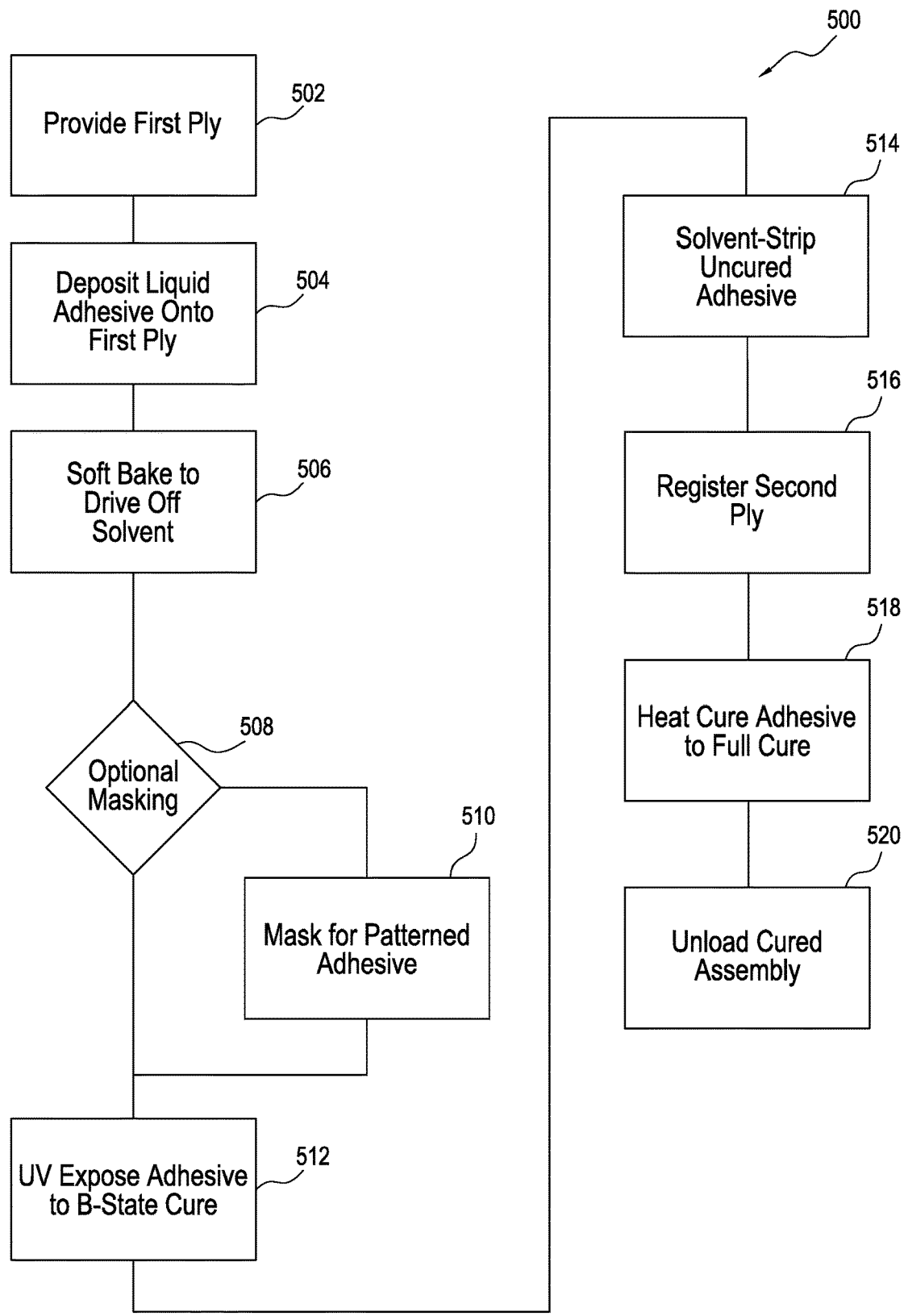
FIG. 5 shows, in flow diagram form, a portion of an exemplary photo patterning method according to principles of the invention.

FIG. 5 shows, in flow diagram form, a portion of an exemplary method 500 of photo-patterning of adhesive on a substrate ply or sub-laminate. According to the illustrated method, a hybrid adhesive (i.e. two cure mechanisms) is photo-lithographically patterned then cured using a second mechanism. An example is a hybrid UV/thermal cure adhesive.

The Photo-Patterning process is analogous to photolithography steps in MEMS or PCB fabrication. Example commercial adhesives in MEMS include BCB and SU-8, however these materials may not be optimal for μMECS™ materials such as stainless steel and Kapton. Accordingly, in certain embodiments, a custom formulated adhesive will be applied in practice of the invention. In certain embodiments, a photo-patterned adhesive process according to principles of the invention, enables small line/space (2 mil/2 mil) using existing PCB and flex circuit processing equipment.

Figure 6:
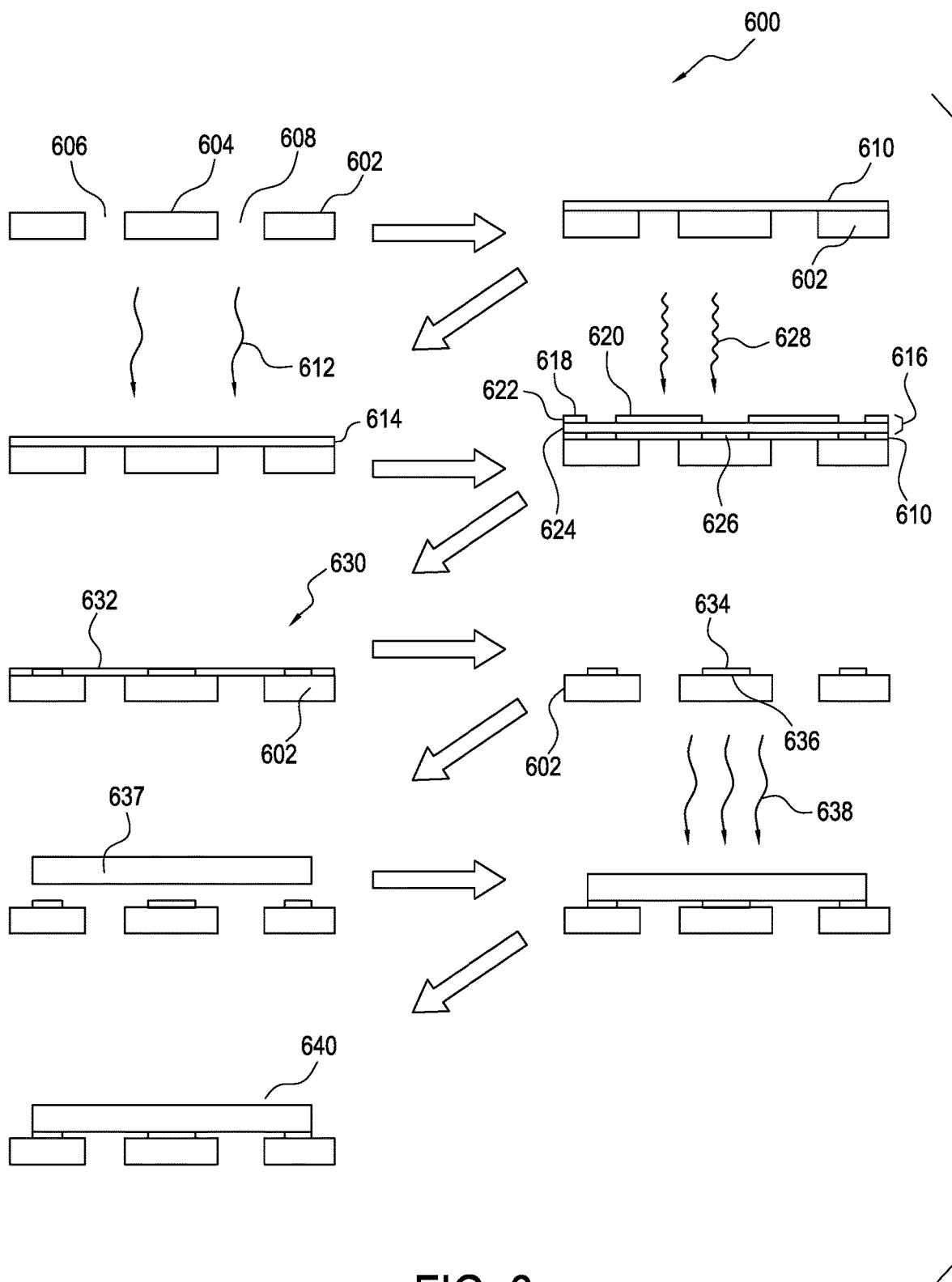
FIG. 6 shows, in schematic cross-section certain states of a ply during a process according to the invention.

FIG. 6 shows, in schematic cross-section, certain states 600 of a ply or sub-laminate 602 during, for example, the method 500 of FIG. 5. Referring now to both FIG. 5 and FIG. 6, a first ply or sub-laminate 602 is provided 502 for processing.

The first ply or sub-laminate 602 is shown in FIG. 6 as having land areas, e.g., 604 and apertures, e.g., 606. As will be apparent from FIG. 6, and from the discussion above with respect to FIG. 4B, adhesive coating of the land areas by liquid, or solid (particulate spray, sheet, gel) methods will be employed according to the requirements of a particular volume manufacturing application. Thus, in the illustrated embodiment, the method 500 includes depositing (e.g. spray, dip, blade, unroll, etc.) 504 the liquid or sheet adhesive onto a firstply.

Where a liquid adhesive is employed, after application it is soft baked 506 to remove solvent, drying and immobilizing it for processing. Depending 508 on the requirements of a particular application, a mask will be applied 510 to pattern the adhesive. Thereafter, the uncured adhesive not covered by the mask is exposed to ultraviolet light 512 to activate the first stage cure mechanism, affixing but not fully curing on a ply (B-stage). A photo-tool, or mask is used to selectively B-stage certain regions of adhesive that remain in the laminate. It will be appreciated by one of skill in the art that negative cure adhesives and negative mass will also be beneficially applied in certain circumstances, in which case exposed adhesive will remain uncured while masked adhesive will cure.

Thereafter, uncured adhesive is removed by solvent or developer strip 514, without damaging B-staged adhesive. Next, a second ply is registered 516 and, thereafter, cured with heat 518 (i.e, by convective, conductive and/or radiative heating). Finally, the fully cured assembly is removed 520 for inspection, packaging and/or further processing.

With reference now to FIG. 6 it will be noted that apertures 608 in the ply 602 may be temporarily filled prior to the application of adhesive, by fixturing and/or a removable filler such as wax and/or polymer material, where appropriate to the requirements of a particular embodiment. This temporary filler may later be removed physically, and/or by chemical dissolution, thermal melting, burning, etc.

Thereafter, a layer of adhesive 610 is applied to the first ply or sub-laminate 602. Where a liquid adhesive is employed, after application it is soft baked 612 to remove solvent, drying and immobilizing the adhesive layer 614 for processing.

Depending on the requirements of a particular application, a mask will be applied 616 to pattern the adhesive. In certain embodiments, the mask will include a single layer of material regions that are, respectively, opaque 618 and transparent 622 the curing wavelengths. In other embodiments (and as illustrated), a layer of opaque material 622 will be supported by a layer of transparent material 624.

Once masked, the uncured adhesive not covered by the mask e.g., 626 is exposed to curing radiation such as, for example, ultraviolet light 628. This exposure is continued with a duration and/or intensity sufficient to activate the first stage cure mechanism, affixing but not fully curing (B-stage) the adhesive 610.

Thereafter, the mask is removed 630 and uncured adhesive 632 is removed from the ply or sub-laminate 602 by solvent or developer strip 514, without damaging B-staged adhesive. The result is a patterned B-staged adhesive 634 disposed at respective surface areas 636 of the ply or sub-laminate 602.

Either immediately, or after inspection and/or storage, a further ply 637 and/or component and/or sub-laminate is registered 516 and, thereafter, cured, e.g., with heat 638 (i.e, by convective, conductive and/or radiative heating), by the application of a chemical catalyst, or other means. Finally, the fully cured assembly is removed 640 inspection, packaging and/or further processing.

Liquid or paste adhesives deposited by inkjet or screen print have difficult to control bond lines. Several techniques are available that maintain a thin, controlled bond line to meet the requirements of the present invention. These include, among others, the incorporation of solid particles, such as those found in electrically or thermally conductive adhesives; the use of a rigid sheet of material of the required bond line thickness between plies; and a two-step adhesive printing process, wherein a first layer of adhesive is deposited and cured to create a separation between plies during the second adhesive cure step.

A further novel and beneficial improvement includes the application of rapid curing adhesives in high-volume manufacturing of μMECS™ components and systems. Whereas state of the art μMECS™ prototyping requires 30 minutes tack bond and 5 hour cure per lamination, the cycle times are not compatible with high-volume production methods according to the present invention. One exemplary high-volume product would require four lamination cycles during production, or 22 hours in a press; a major bottleneck to high volume production.

Advantageously, a method according to the invention includes the simultaneous lamination of multiple panels and, thereafter, rapid cooling in a second press, freeing the heated press to conduct further processing during the cooling stage of already-heated work in process materials.

In a further embodiment of the invention, plies and/or sub-laminates and/or components are combined using a Pyralux™ adhesive; data sheets suggest 5 minutes at 250° C. is sufficient. It should be noted that this solution requires prohibitively high temperature for certain materials, and comes at the cost of increased laminate stresses.

High throughput adhesives, particularly used in electronics assembly, are alternatives to the slow B-staged Pyralux material. A wide range of adhesives are compatible with μMECS, and a universal solution doesn't exist for all applications and materials. Careful consideration of substrate material compatibility, required throughput, deposition method, cured adhesive properties (e.g. Young's modulus, peel strength, bond line, feature size), and cost are required for μMECS adhesive selection. Example embodiments are presented here in the context of building the THC, a stainless steel and polyimide construction.

Light curing adhesives Light (or radiation) cure adhesives are activated by UV or visible light and have full cure times on the order of seconds, some lower than 1 s. Light curing adhesives are typically single component with a long shelf life, making handling and storage easy. Many light cure adhesives are manufactured for high volume electronics assembly by major adhesive companies such as Henkel and 3M. Although heat will speed up cure reactions, light activated adhesives can cure at room temperature, eliminating thermal mismatch and enabling a wide range of materials in μMECS™ components. Light curing adhesives generally have a faster processing time than thermal, however selection should also consider material ply compatibility, cost, desired throughput, printing method, and cured mechanical properties.

A solution for opaque μMECS laminates is a pre-activated light curing adhesive. Pre-activated adhesives have a delayed curing mechanism; the adhesive has a working time of several seconds after light exposure, during which the two materials can be registered and joined. One example adhesive is a delayed cure cationic such as KATIOBOND 4595 (DELO).

Figure 7:
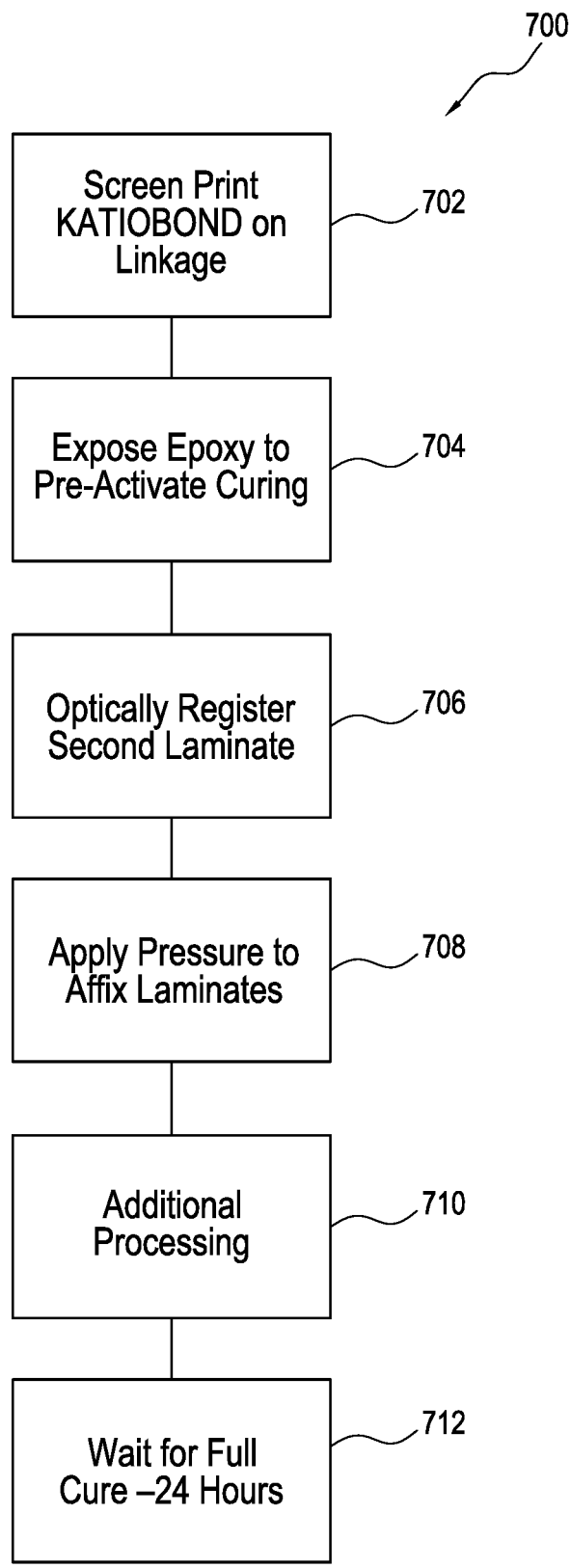
FIG. 7 illustrates, in flow diagram form, a method for delayed adhesive curing according to principles of the invention.

FIG. 7 illustrates, in flow diagram form, a method or process 700 for delayed UV/visible light curing adhesive beneficially applied in certain embodiments the present invention. According to method 700, effective results will be achieved by screen printing 702 KATIOBOND 4595 (DELO) onto a μMECS™ linkage laminate. The printed pattern places adhesive only in areas required for selective adhesion to another laminate. Thereafter, expose 704 the epoxy to 460 nm wavelength light (55 mW/cm2 intensity for 5 s) to pre-activate the curing mechanism. Thereafter, optically register 706 a second laminate to the first using vision recognition of fiducials on both laminates. Preferably, registration will happen within the 18 s open time of the KATIOBOND 4595, or the corresponding open time of an alternative adhesive. Thereafter, apply 708 very light pressure (<5 PSI) to affix the two laminates while the adhesive cures.

The bonded laminates are strong enough for further processing 710 (e.g. subsequent release and lamination cycles), however the adhesive will reach full strength 712 within 24 hours at room temperature.

Thermal snap cure adhesives are formulated for high volume electronics assembly and can come as a one or two part printable liquid or paste, or a B-staged film. Additionally, adhesives can be printed directly onto a laminate and B-staged for later processing. To bond plies with thermal cure adhesive, heat can be applied by convection oven (e.g. batch or tunnel oven), direct contact (e.g. press, heated stamps, or thermodes), induction (for electrically conductive plies), and infrared radiators. Setting time for snap cure adhesives can be lower than 1 minute, allowing fast panel lamination and release cycles. For some adhesives, a thermal post-cure will be required to reach full strength, which can be processed in large batches.

Adhesive selection criteria includes pattern de-position method (e.g. screen, jet), compatibility with ply materials, throughput requirements, and cured mechanical properties (e.g. Young's Modulus, shear strength, and bond line). Example adhesives include H70E-4, H70E, and H74 epoxies (Epoxy Technology), DE-LOMONOPOX MK055 (DELO), and ABLE-BOND 8387B (Henkel).

Figure 8:
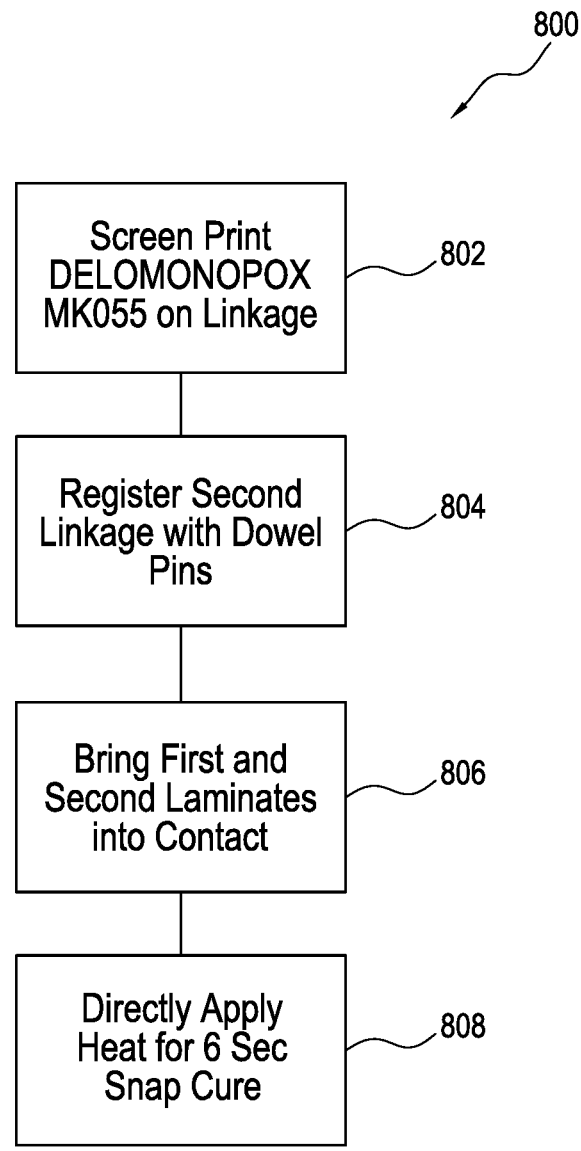
FIG. 8 illustrates, in flow diagram form, a method for a two pass thermal snap adhesive cure according to principles of the invention.

FIG. 8 illustrates, in flow diagram form, a method or process 800 for a two-pass thermal snap cure μMECS™ process. According to method 800, effective results will be achieved by screen printing 802 1 mil DELOMONOPOX MK055 (or equivalent) adhesive paste on top of a μMECS™ linkage laminate. Thereafter, register 804 a second linkage laminate using dowel pins through interference fit holes in the laminates; bring the two laminates in contact 806. Thereafter, directly apply heat 808 (200° C.) using a heated stamp to the top substrate for 6 s to snap cure the adhesive. The resulting laminate can undergo further processing (e.g. intermediate release and subsequent lamination) or final release.

Figure 9:
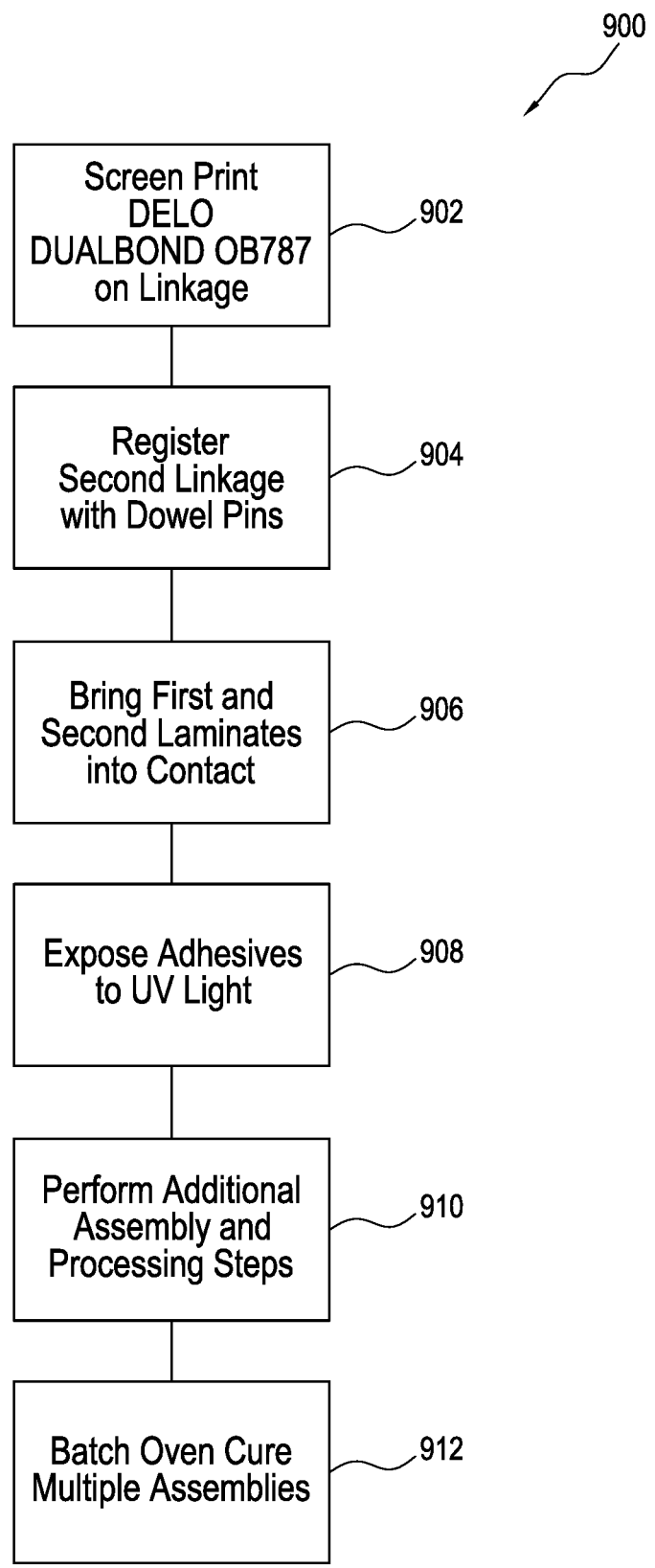
FIG. 9 illustrates, in flow diagram form, method for employing hybrid cure adhesives according to principles of the invention.

FIG. 9 illustrates, in flow diagram form, a method or process 900 for the application of hybrid cure adhesives in a μMECS™ process. Designed for applications with bond regions shadowed from light, hybrid cure adhesives can be activated with UV/visible light to bond transparent substrates or an exposed adhesive fillet. Final cure strength is achieved by a thermal cure. In μMECS, the edges of a bonded laminate can be light-cured to establish bond strength for additional processing (e.g. release and subsequent lamination). Once all process steps are complete, an entire laminate can be thermally cured for full bond strength.

According to method 900, effective results will be achieved by screen printing 902 1 mil hybrid UV/thermal cure adhesive (e.g. DELO DUALBOND OB787 or equivalent) onto a μMECS linkage sub-laminate. Thereafter, register 904 a second linkage sub-laminate using dowel pins through interference fit holes in the laminates. Thereafter, bring the two laminates in contact 906. Subsequently, expose 908 to 55 mW/cm2 355 nm UV light for 9 seconds, curing the adhesive exposed around edges. Thereafter, continue processing 910 the new laminate (e.g. release, subsequent lamination, or component pick and place). Oven cure 912 the shadowed adhesive at 150 C for 10 minutes. A large batch of panels can be simultaneously cured.

Alternative cure mechanisms, according to principles of the invention, with μMECS™ applications include humidity cure and anaerobic cure, and combinations of any of the foregoing. In addition, hybrid cure adhesives have application in sub-component assembly, especially electromagnetic or other actuation components. B-staged adhesive A modified version of the thermal snap or radiation cure adhesives. Adhesive is printed directly onto linkage or spacer sub-laminates during their fabrication. The adhesive is B-staged, forming a dry, immobile, film that can be handled or processed later. B-staging can occur by one of several mechanisms, including solvent evaporation or first stage (for a hybrid adhesive) cure. B-staging printed adhesives provides several advantages for storage, handling, and processing. First, adhesive deposition and printing can occur at a separate facility, or at a separate time from the multilayer lamination and cure step. Additionally, B-staged material can have highly controllable bond line and be of higher molecular weight (more advanced cure), reducing flow.

Figure 10:
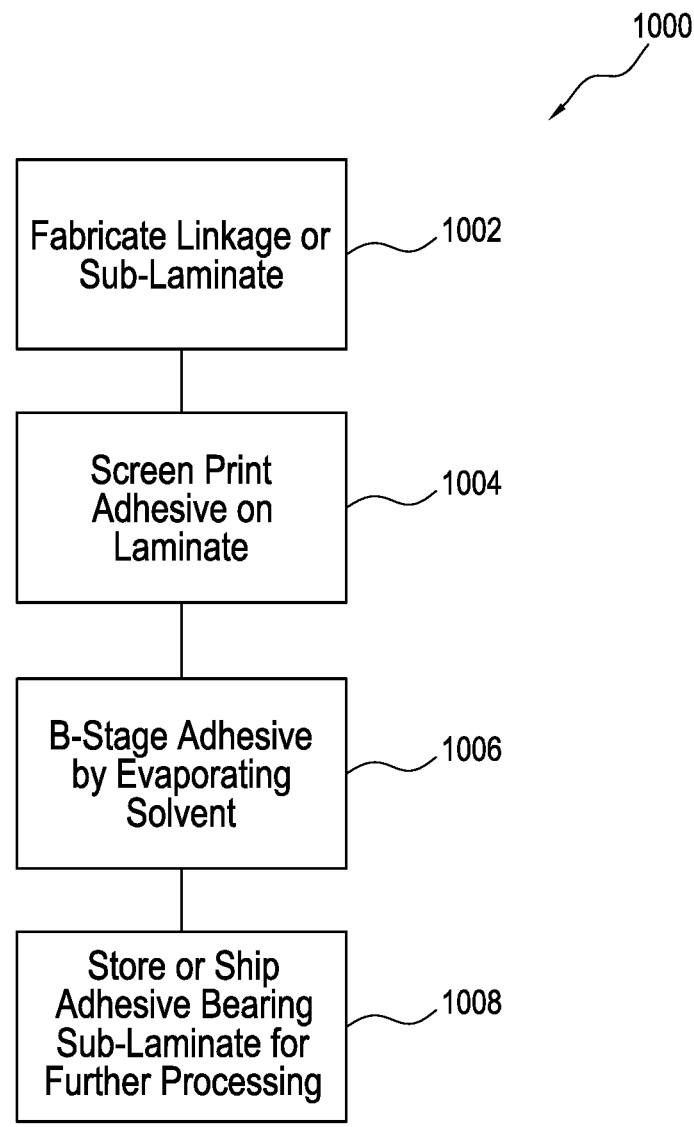
FIG. 10 illustrates, in flow diagram form, certain aspects of a method according to principles of the invention.

FIG. 10 illustrates, in flow diagram form, a method or process 1000 for an exemplary B-stage adhesive process for μMECS™. According to method 1000, effective results will be achieved by fabricating 1002 a linkage or spacer sub-laminate. Thereafter, screen printing 1004 adhesive onto the constructed laminate. Thereafter, B-staging the adhesive 1006 by evaporating solvent, forming a 25μ dry film that will not cure or damage when subjected to shipping, handling, or storage conditions; and thereafter shipping 1008 the sub-laminate and adhesive for assembly at a separate facility.

Pressure Sensitive Adhesives (PSAs) are commonly used in high throughput lamination applications. Liquid precursors can be printed on liner or directly on substrate, then dried or UV cured in-line to form a tacky surface; die cutting or digital (laser) converting transfer tape is also feasible. Second substrate can then be registered and cured with brief application of pressure. Thin bond line (0.001") and fine features (<0.006") are possible with PSAs. Downsides to PSAs include lower adhesive strength, high temperature resistance, and mobility after placement. However, their fast, low cost processing makes them a candidate for some μMECS applications.

The present invention includes systems and methods for reducing manufacturing time including reducing the time required for release of completed components from surrounding scaffolding structure. Prototype production of the μMECS™ THC release uses a 20 W 355 nm UV laser to drill individual bridges that retain sub-strate to webbing. Laser drilling is applicable to vol-ume production, and widely used in rigid and flexible PCB manufacture for via drilling, routing, and depaneling. The appropriate laser technology will depend on materials and feature size, however UV, IR, and CO2 lasers are broadly applicable. Alternatives to laser release include die cutting and routing, also commonly used in PCB manufacturing.

Release process time is dominated by thick, poor machinability materials like stainless steel. In pro-duction, specialized tools are required for high throughput release of rigid materials. The Stencil-Laser G6080 (LPKF), for example can machine up to 800 stainless steel bridges per minute using a $200 k system. For a complex, high throughput component like THC (450 bridges per part), each laser is only capable of 1-2 PPM throughput. In addition, the specialized IR laser thermally damages most other materials like polyimide and adhesive.

It's advantageous to minimize or eliminate rigid material bridges by substituting a more machinable material. Several solutions exist for linkage and spacer laminates that enable release to thousands of bridges per minute. For example, in certain embodiments and applications, it is advantageous to machine individual plies on a sacrificial film carrier. Each μMECS ply, laminated to a sacrificial film, can be selectively etched to pattern substrate and chip islands. The film carrier is removed or decomposed. The following represent materials advantageously employed in various embodiments of the invention.

A) Soluble films. For example polyvinyl alcohol (water-soluble), MEMS wafer processing films (isopropynol-soluble), and dry film photoresist (developer-soluble). These films can be batch dissolved after lamination.

B) Thermally decomposing films. For example thermoset plastics that degrade during or after lamination.

C) Melting films. For example hot melts or wax that melts during or after lamination.

D) Biodegradable films. For example biodegradable PET. Degradation is slow, however can be accelerated with external mechanisms such as water or heat.

Linkage laminates are an important element of many μMECS™ components, and include of rigid links and flexure hinges. Exemplary composite laminate construction includes at least two rigid material plies sandwiching one flexible material ply, and hinges are nominally created using the process described above with respect to FIG. 1.

The material-independent composite layup of a linkage laminate is: [Rigid/Adhesive/Flexure/Adhesive/Rigid], however adhesiveless constructions are also possible. An alternative construction includes just one rigid layer bonded to one flexure layer, however designs incorporating this construction are susceptible to peel stress delamination during flexure bending.

In certain aspects, the present invention includes methods for high volume linkage laminate production. For example, one embodiment is a straightforward adaptation of the current prototype methods, however using high-throughput processes and equipment. In this method, each material ply (two rigid, one flexible) is machined using an appropriate process for the material, thickness, features, tolerances, speed, and cost. Candidates include, but are not limited to, photochemical machining (etching), laser cutting, water-jet cutting, die cutting, electroforming, and electrical discharge machining (EDM).

Like printed circuits, μMECS™ planar features can be evaluated by 'trace and space', a linear dimension that represents the smallest physical features and smallest holes that can be machined. THC, for example, requires trace/space as small as 8 mil/2 mil in linkage laminates. Chemical etching is a strong candidate for THC's thin gauge stainless steel and polyimide construction. Etching has an added benefit of minimal post-processing time because there are no chads, burrs, or machining stresses.

The Pre-Patterned Plies method uses an adhesive patterned prior to lamination, however is agnostic to selective adhesion process. One embodiment of the Pre-Patterned Plies method is illustrated in FIG. 11.

Figure 11:
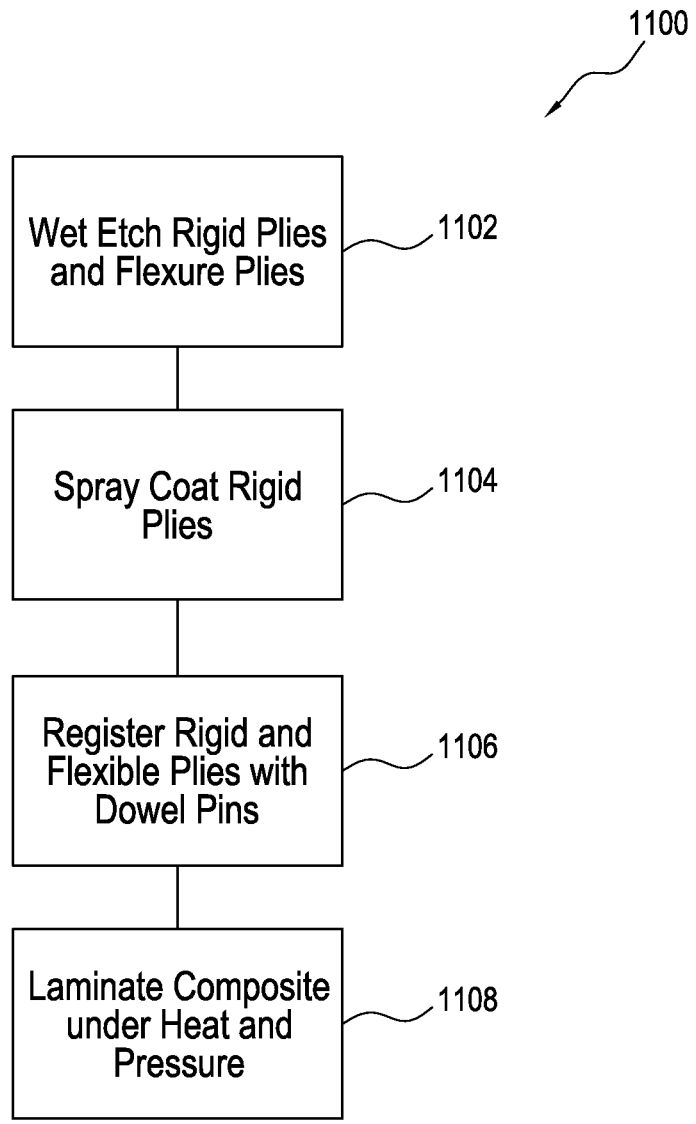
FIG. 11 illustrates, in flow diagram form, further aspects of a method according to principles of the invention.

FIG. 11 shows, in flow diagram form, a method and process 1100 of preparing pre-patterned plies including wet etching 1102 two 0.002" AISI 304 full hard stainless steel (rigid) plies and one 0.001" Kapton polyimide (flexure) ply with desired geometries. Thereafter, both stainless steel plies are coated 1104 by spraying 0.0005" thick (dry) B-staged epoxy using an ultrasonic sprayer (Ultrasonic Systems Inc). Plies are registered and retained by dowel pins 1106. Subsequently, the [Stainless/Epoxy/Kapton/Epoxy/Stainless] composite is laminated 1108 under heat and pressure. Many linkage laminates can be laid up and pressed in parallel to increase throughput.

Figure 12:
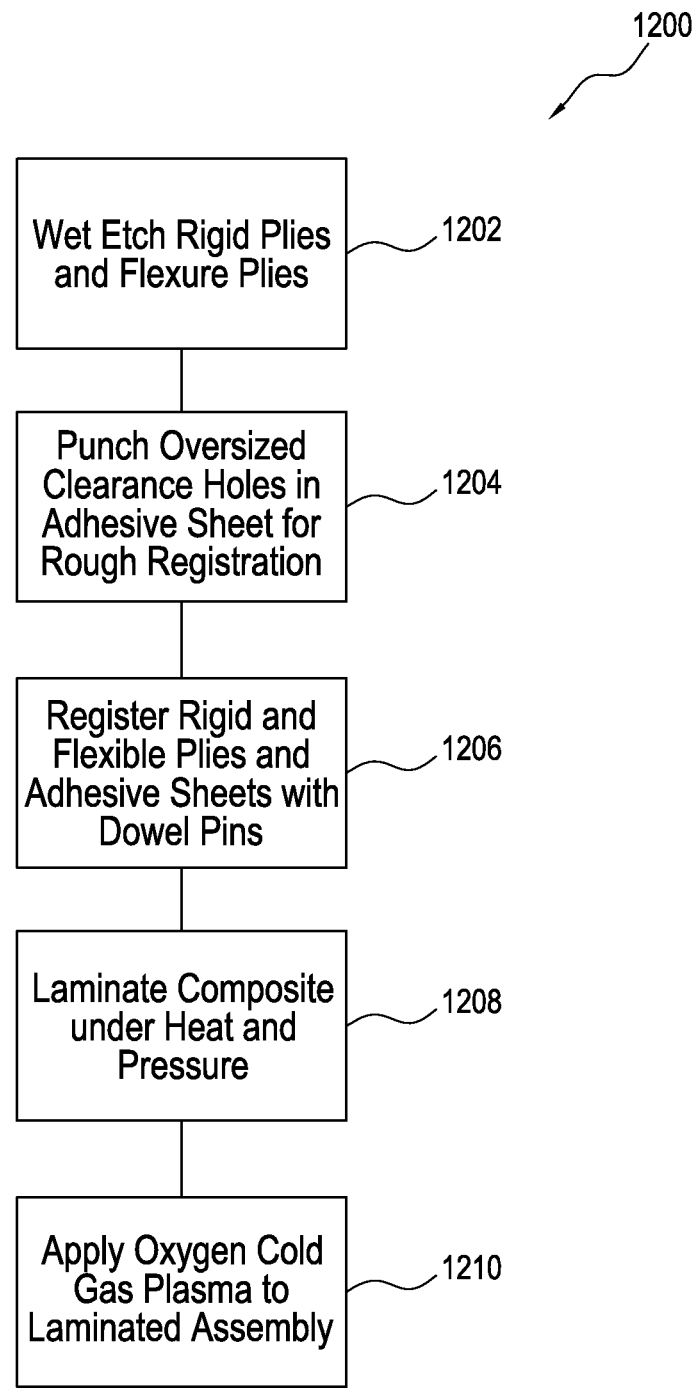
FIG. 12 illustrates, in flow diagram form, still additional aspects of a method according to principles of the invention.

FIG. 12 shows, in flow diagram form, a further exemplary method and process 1200 that employs plies similar to those of method 1100. However, plies are laminated with an un-patterned adhesive, which is machined after lamination by chemical etching, plasma etching, or thermal decomposition. The adhesive material can be applied in a uniform film, compatible with the material plies, and selectively removed after lamination. Examples include but are not limited to: B-staged film (epoxy or acrylic), pressure sensitive adhesive (PSA), and thermoplastic (hot melt). In this method, the rigid pre-patterned plies can be used as a mask, or an additional mask can be applied (e.g. photoresist) to protect the rigid plies from the adhesive removal process.

Process 1200 include the steps of wet etching 1202 two 0.002" AISI 304 full hard stainless steel (rigid) plies and one 0.001" Kapton polyimide (flexure) ply with desired geometries. One of skill in the art will appreciate that the indicated ratios are intended to be multiplied according to the desired throughput of the process. The un-patterned adhesive doesn't require precise registration; oversized clearance holes can be punched into the adhesive, allowing dow the construction el pin pass-through. Accordingly, punch large clearance holes through adhesive sheet 1204. Thereafter, using 0.000500 thick DuPont Pyralux FR B-staged film adhesive (a modified acrylic), lay up and laminate 1206 the [Stainless/Acrylic/Kapton/Acrylic/Stainless] composite under heat and pressure. Rigid and flex plies are registered and retained by dowel pins 1208. Many linkage laminates can be laid up and pressed in parallel to increase throughput. Thereafter, the laminated assembly is subjected to a 100% oxygen cold gas plasma 1210 (e.g. Plasma Etch BT-1) to etch exposed adhesive. The rigid stainless steel acts as a mask, protecting underlying adhesive from etching. Etch power and duration should be precisely controlled to prevent damage to the Kapton once adhesive has been removed.

Figure 13:
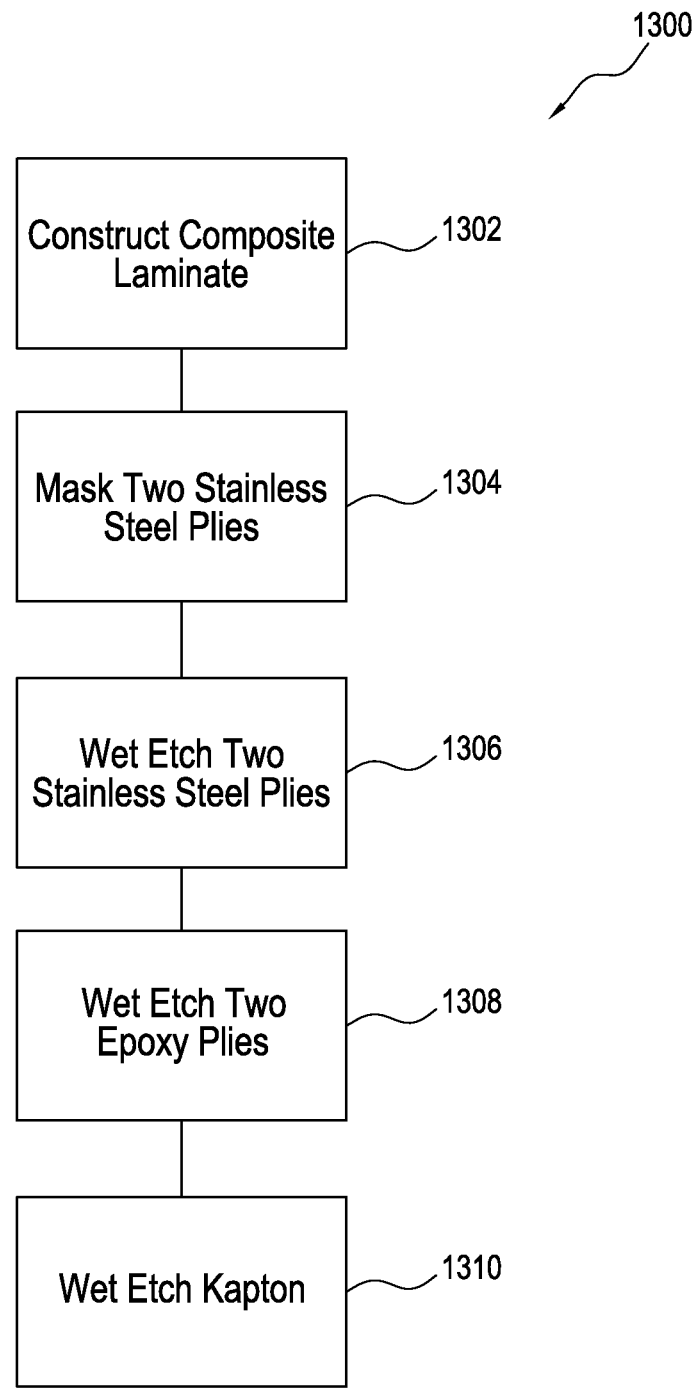
FIG. 13 illustrates, in flow diagram form, yet other aspects of a method according to principles of the invention.

FIG. 13 illustrates, in flow diagram form, a still further aspect of the invention in which two outer rigid plies are laminated to the central flex ply before machining. The assembly can be adhesive based or adhesiveless, meaning rigid plies can be directly bonded to the flex material. An example adhesiveless construction employs DuPont's Pyralux AC copper-clad Kapton. Each ply of the laminate is selectively machined using etching (chemical or dry) processes to form links and hinges.

A benefit of the pre-lamination method is the capability to pattern unsupported islands of material in rigid plies. The islands are adhered and retained to webbing by the flex ply. The pre-laminated structure improves release throughput and cost by eliminating rigid ply bridges; flex material can be machined faster and with lower energy.

With further reference to FIG. 13, for a stainless steel and Kapton polyimide linkage laminate an exemplary process 1300 includes constructing 1302 the composite laminate: [Stainless/Epoxy/Kapton/Epoxy/Stainless] from 0.001500 AISI 304 full hard stainless steel, 0.000500" Kapton HN (DuPont), and 0.00100 Hanwhaflex HGB-E500EG (Hanwha L&C) epoxy. Thereafter, mask 1304 and selectively photochemically machine (wet etch) 1306 the two stainless steel plies. Retained features are masked using a patterned, dry film photoresist. Each layer requires a separate phototool and must be registered precisely during photoresist exposure; <0.0005" registration is achievable using state of the art PCB exposure equipment. Substrate and chips are adhered directly to Kapton and require no bridges to webbing. Photochemical etching industry standards can achieve 3 mil/3 mil trace and space, with the possibility of smaller features depending on required yield.

Subsequently, selectively wet etch 1308 the two epoxy plies simultaneously. The resulting patterned features match those of the stainless steel; no undercutting is required. Features are masked using a patterned, dry film photoresist. Each layer requires a separate mask and masks must be registered precisely during exposure.

Finally, selectively wet etch 1310 the Kapton polyimide, retaining flexure hinges and bridges. The Kapton will connect the entire μMECS component in webbing for later processing steps (e.g. lamination and release).

The High Density Interconnect (HDI) flex circuit is another specific embodiment of the Pre-Lamination Method. HDI technology is driven by the demand for increased density in rigid and flexible PCBs, with trace/space requirements lower than 30 jtm. In the HDI embodiment, a single or double-sided flex circuit is used as the linkage laminate, with copper as the rigid layer. Flex material (base substrate or dielectric in PCB terminology) is chosen based on material properties and process conditions; commonly polyimide, polyester, and flourocarbon are used.

Figure 14:
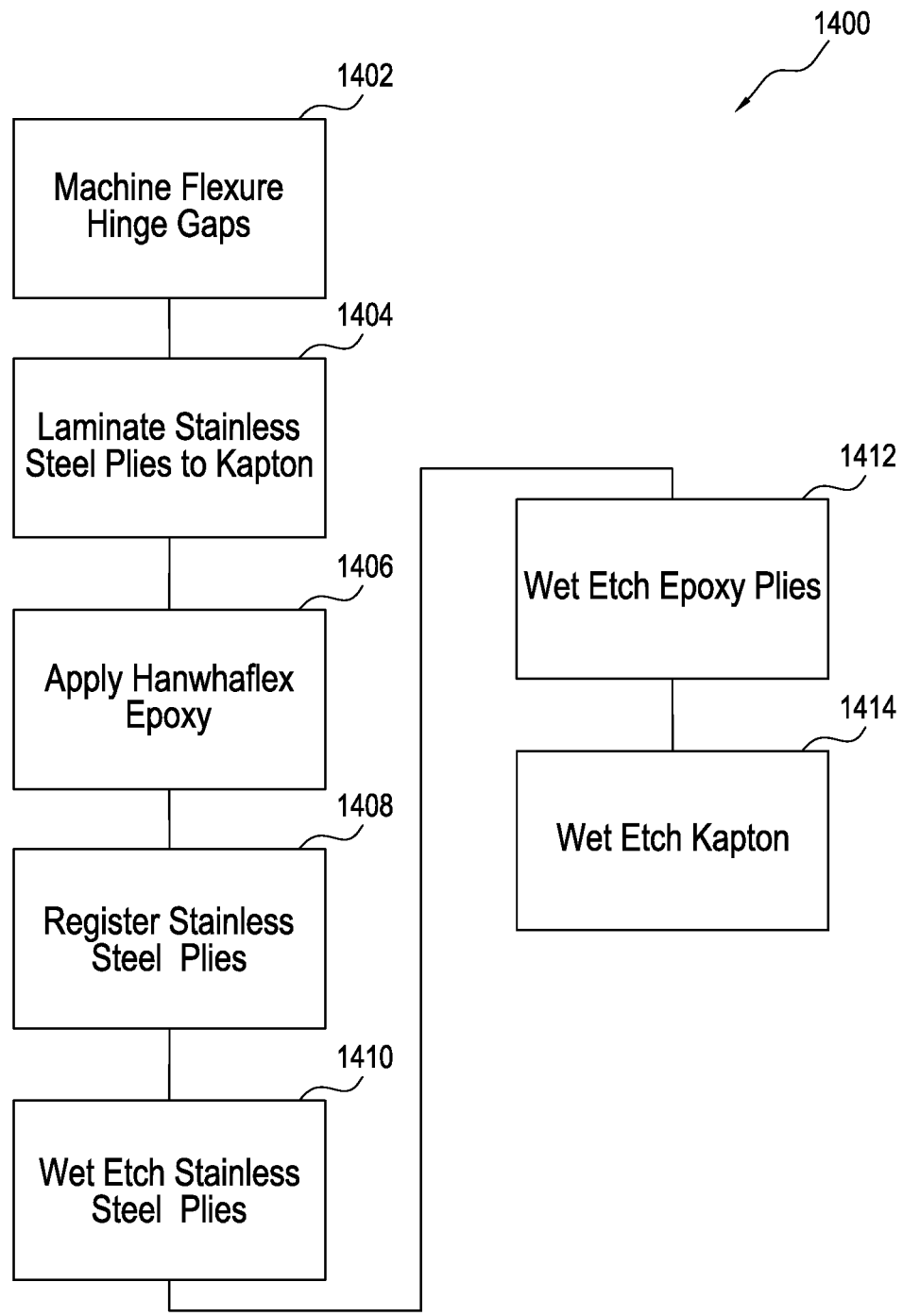
FIG. 14 illustrates, in flow diagram form, certain additional aspects of a method according to principles of the invention.

FIG. 14 shows, in flow diagram form, a further high-volume manufacturing method 1400 termed the Hybrid Machining Method. The Hybrid Machining Method enables fine, tight tolerance features with improved unit cost and throughput over pre-machining methods. In general, Hybrid Machining is applicable to µMECS linkage laminates with infrequent precision features. An example application is flexures with smaller and tighter tolerance features than other planar features. In this case, precision flexure pre-machining (e.g. by laser) can be combined with high throughput methods (e.g. etching) for remaining features.

In this context, method 1400 includes using, for example, a 355 nm UV laser with 10µ spot size to machine 1402 35µ×100µ flexure hinge gaps into 0.00200 AISI 304 full hard stainless steel plies. Include fiducials and dowel pin holes for realignment. Thereafter, laminate 1404 the stainless steel plies to a 0.000500 Kapton HN flex ply, forming the [Stainless/Epoxy/Kapton/Epoxy/Stainless] composite. Thereafter, apply 1406 0.00100 Hanwhaflex HGB-E500EG (Hanwha L&C) for the epoxy. Thereafter, register 1408 the two steel layers using dowel pins. It should be noted, however, that the Kapton and adhesive require no alignment and can be punched with dowel pin clearance holes. Thereafter, selectively wet etch 1410 the remaining features in the two stainless steel plies. Retained features are masked using a patterned, dry film photoresist. Each layer requires a separate phototool and must be registered to the pre-machined flexure gaps precisely during exposure. Only substrate and chip material is retained in the stainless steel; islands of material are bonded to Kapton. Thereafter, selectively wet etch 1412 the two epoxy plies simultaneously.

The patterned features match that of the stainless steel; no undercutting is required. Retained features are masked using a patterned, dry film photoresist. Each layer requires a separate mask and masks must be registered precisely during exposure. Thereafter, selectively wet etch 1414 the Kapton polyimide, retaining flexure hinges and bridges. The Kapton will support the µMECS component in webbing for later processing steps (e.g. lamination and release).

Spacers are generally rigid materials used to separate linkage sub-laminates or serve as mechanical ground in µMECS laminates. Common examples include patterned 0.002"-0.025" polyimide or steel sheets. In general, spacers can be fabricated by any machining method (e.g. laser, die cut, waterjet, chemical etch, EDM, electroforming) appropriate for the material, thickness, feature size, and tolerances.

Often, spacers require features smaller than the constraints imposed by material thickness. In this case, spacers can be fabricated from many thin materials that are machined, stacked, and laminated to achieve the desired thickness. An example is a 0.023" stainless steel spacer with minimum slot size 0.006". This high aspect ratio hole is difficult to machine from stock. One solution is to chemically etch four 0.005" stainless sheets and adhere them with 0.001" adhesive. In this case the adhesive pattern identically matches that of the spacer material, and can be patterned using processes such as process 1200 or process 1300, for example, as described above.

Similar to linkage laminates, thick spacer bridges can be eliminated by using the Pre-Lamination Method described in relation to process 1300 above. However, a thin, machinable film or foil must be added to spacers in lieu of the flex ply in linkages. A consequence of the Pre-Laminated Spacer in Carrier is a reduction in stiffness and yield strength at the thin carrier and adhesive interface. However, this method is suitable for components subjected to relatively low forces.

Figure 15:
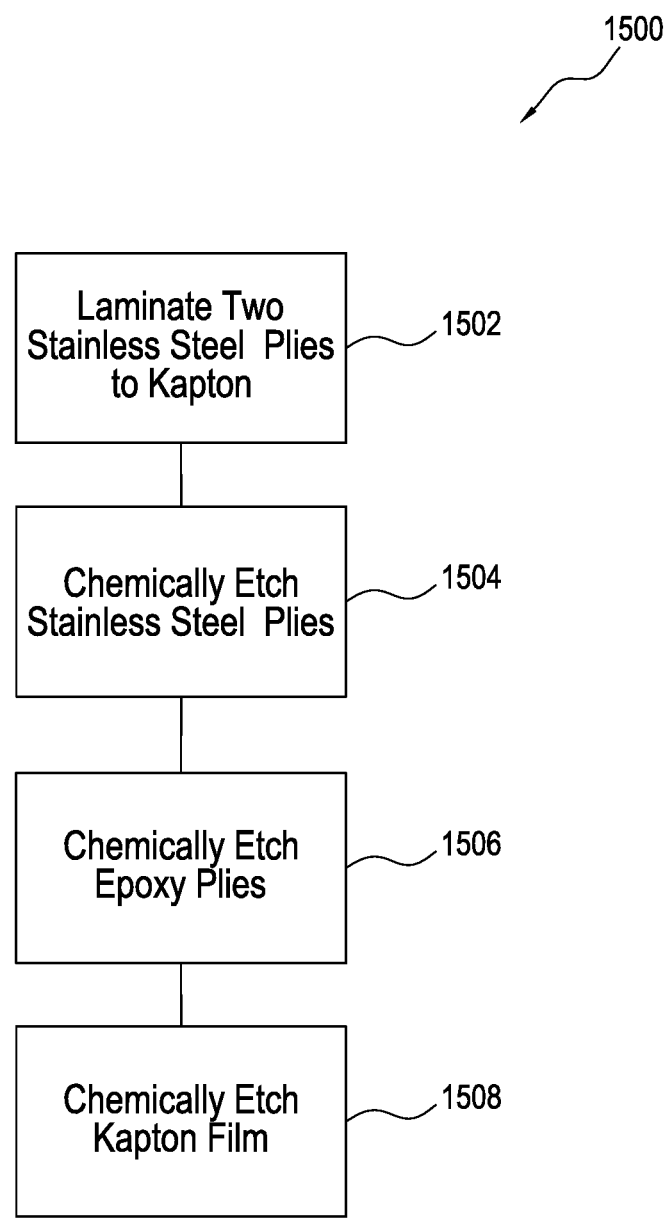
FIG. 15 illustrates, in flow diagram form, still more aspects of a method according to principles of the invention.

FIG. 15 shows, in flow diagram form, exemplary process 1500 to fabricate, for example, a carrier-supported 0.006" stainless steel spacer. Process 1500 includes laminating 1502 two 0.002" AISI 304 FH stainless steel sheets to a 0.001" Kapton HN polyimide film using Hanwhaflex HGB-E500EG epoxy, forming the composite [Stainless/Epoxy/Kapton/Epoxy/Stainless]. Thereafter, chemically etching 1504 the two stainless steel plies with the desired spacer pattern. Retain only substrate and chip material, without bridges. Thereafter, chemically etch 1506 the Hanwhaflex epoxy plies with an identical pattern to the stainless steel spacer. Thereafter, chemically etch 1508 the Kapton film, leaving bridges to retain the stainless spacer to webbing. This step can be omit if Kapton is fully machined during release steps.

It should be noted that the Prelaminated Spacer on Carrier Method can additionally be used to join two consecutive spacers with different patterns in a µMECS laminate. The only required change to the above process is using different top and bottom masks for chemical etching.

Figure 16:
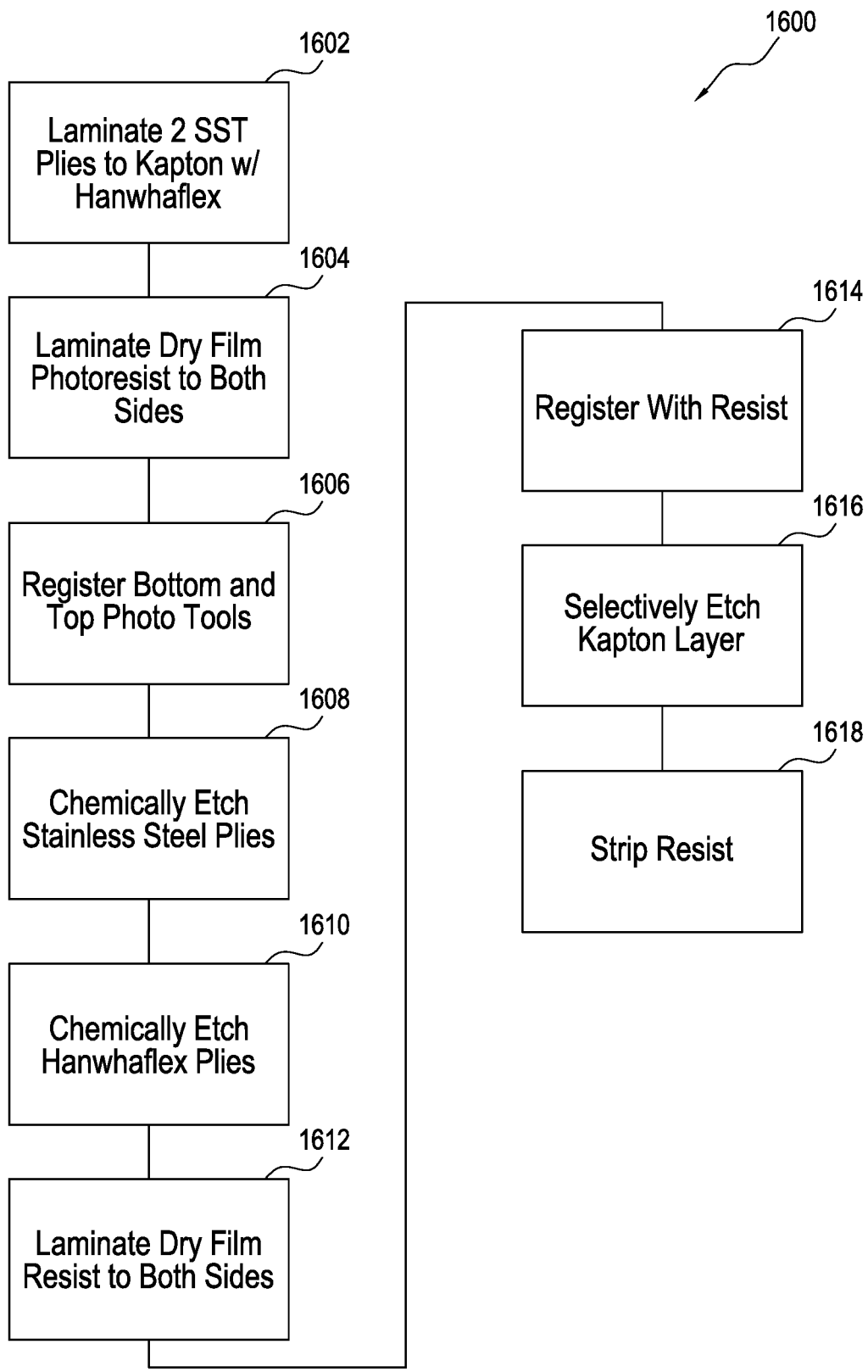
FIG. 16 illustrates, in flow diagram form, other novel aspects of a method according to principles of the invention.

FIG. 16 shows, in flow diagram form, a still further beneficial process 1600 according to principles of the invention. In this process 1600 three linkage laminates, L1-L3, are fabricated using the Linkage Pre-Lamination Method discussed above in relation to process 1300. Each linkage laminate requires four photo-tools: two to define steel and adhesive, and two (identical) to define Kapton. Linkage laminates are fabricated as follows.

Laminate 1602 the two 0.0015" stainless plies and 0.0005" Kapton ply using 0.0005" Hanwhaflex HGB-E500EG adhesive, forming the symmetric composite [Stainless/Hanwhaflex/Kapton/Hanwhaflex/Stainless]. Thereafter, laminate 1604 dry film photoresist to both sides of the composite. Subsequently, precisely register 1606 bottom and top side photo-tools and selectively pattern the resist. Thereafter, chemically etch 1608 both stainless steel plies, leaving islands of material for substrate and chips. This is followed by chemically etching 1610 the Hanwhaflex plies to match the adjoining stainless steel, followed by resist strip. Thereafter, laminate 1612 a new dry film resist to both sides; and thereafter precisely register 1614 Kapton pattern photo-tools to the etched stainless and pattern the resist. Thereafter, selectively etch 1616 through the Kapton layer from both sides. Strip the resist 1618. Kapton will serve as both flexure bridge and thin film carrier for the linkage laminates.

The µMECS™ laminate consists of 3 linkage laminates, 7 spacers, and 9 unique printed adhesive layers.

THC has seven stainless steel spacers of the following thicknesses: S1) 0.002", S2) 0.005", S3) 0.011", S4) 0.005", S5) 0.005", S6) 0.017", S7) 0.023". All spacers are chemically etched on carrier using the Pre-Laminated Spacer on Carrier Method (Section 4.4.1). The minimum feature size in all plies is 150 jtm (0.006"), however typical minimum etched hole size is 110% material thickness. Excepting S1, each spacer is divisible by 0.005" sub-laminates and 0.001" adhesive between each sub-laminate (e.g. S3 is constructed of two 0.005" sub-laminates bonded by 0.001" adhesive). Therefore, a standardized 0.005" spacer construction is used: [Stainless/Epoxy/Kapton/Epoxy/Stainless], with 0.0015" 304 full hard stainless steel, 0.0005" Hanwhaflex HGB-E500EG epoxy, and 0.0005" DuPont Polyimide Kapton HN. The additional 0.001" adhesive between sub-laminates is printed during laminate assembly.

The THC is presented as an exemplary application of manufacturing process according to principles of the invention. THC is a nonlinear haptic motor for mobile and wearable electronics. Its manufacturer is herewith described to illustrate the application of mass production methods to μMECS™ processing.

Figure 17:
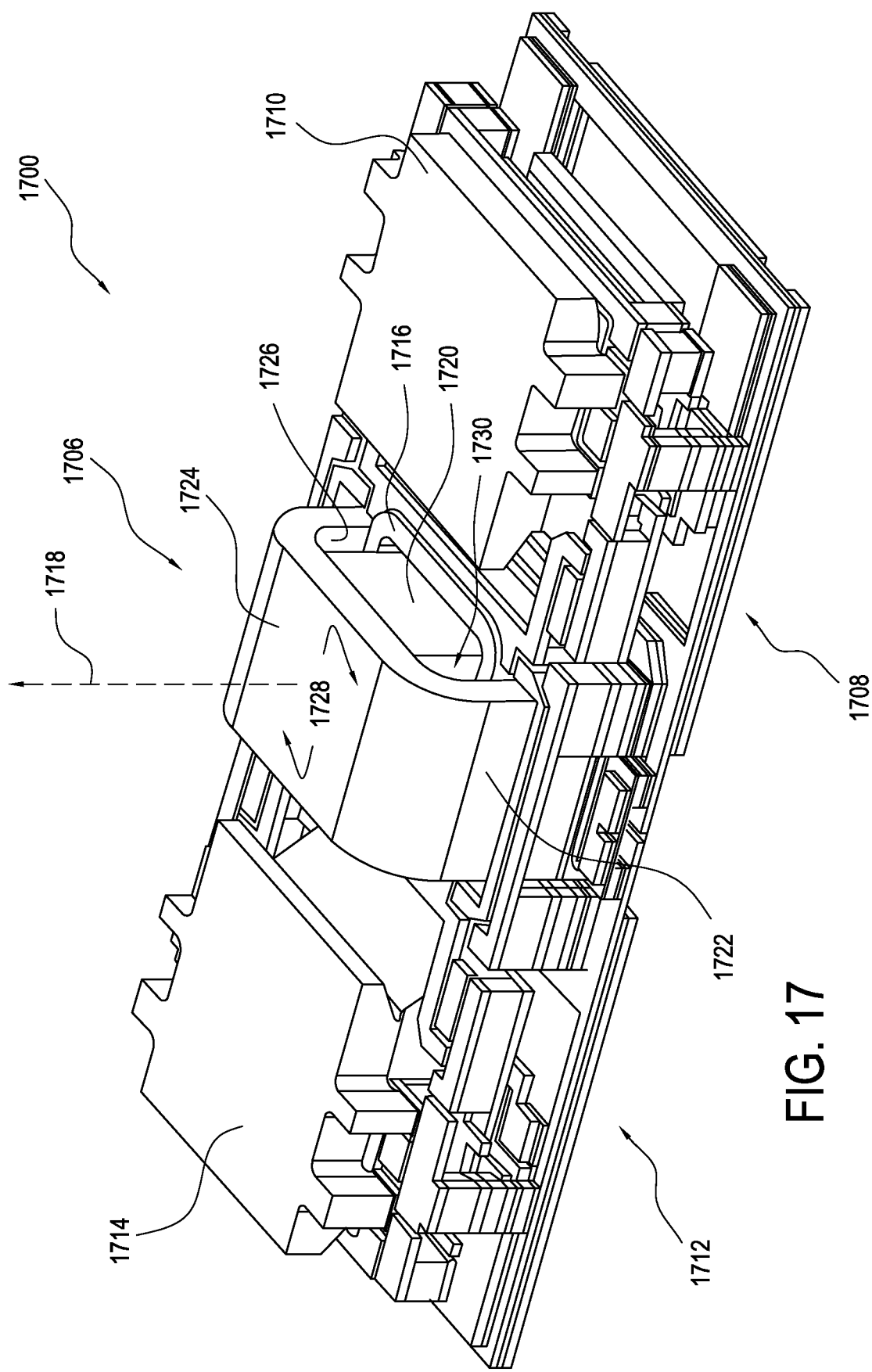
FIG. 17 illustrates, in schematic perspective view, certain aspects of an electro-mechanical device prepared by a method according to principles of the invention.

In this context FIG. 17 shows, in perspective view, a portion of a THC 1700, prepared according to principles of the invention. Haptic actuator 1700 includes, inter alia, a motor portion 1706. Motor portion 1706 is coupled through a first transmission portion 1708 to a first inertial mass 1710. Motor portion 1706 is also coupled through a second transmission portion 1712 to a second inertial mass 1714.

In the illustrated embodiment, the motor portion 1706 includes a linear motor apparatus having a movable armature coil 1716. The movable armature coil 1716 is arranged generally concentrically about a longitudinal axis 1718 of a stator element 1720. The apparatus is arranged such that, during operation of the haptic actuator 1700, the movable armature coil 1716 moves substantially linearly in a direction substantially parallel to longitudinal axis 1718.

A keeper element, 1722 includes an external surface region 1724 and an internal surface region 1726. A portion 1728 of external surface region 1724 is disposed substantially normal to longitudinal axis 1718. Internal surface region 1726 defines an internal spatial region 1730 of the keeper element 1722, within which is disposed, at least, respective portions of stator element 1720 and armature coil 1716.

In certain embodiments of the invention, stator element 1720 includes a permanent magnet. In some embodiments of the invention, the keeper element 1722 includes a permanent magnet. In other embodiments of the invention, one or both of the stator element 1720 and the keeper element 1722 exhibit negligible permanent magnetism.

In certain embodiments, one or more of the stator element 1720 and the keeper element 1722 will include a respective plurality of laminated sheets of magnetic material. In certain embodiments, the laminated sheets of magnetic material will include iron as an elementary metal and/or as a chemical compound. One of skill in the art will appreciate that, in certain embodiments, the keeper element 1722 will include a further portion (not visible in FIG. 17) such that the keeper element 1722 forms a substantially closed magnetic loop encircling the stator element 1720.

In other words, the THC includes a magnetic voice coil actuator driving a tungsten alloy mass through a μMECS™ linkage transmission. The transmission augments the linear voice coil motion and moves the masses along a complex trajectory. Prototype fabrication of THC has been carried out using the laser-based process outlined above with respect to FIG. 1.

An outline for a THC production process targeting >6 PPM throughput is outlined here. This process highlights only μMECS™ laminate and sub-component assembly; sub-component manufacturing is omitted for clarity. One of skill in the art, however, readily understand and practice the invention once in possession of the present disclosure.

The Bill of Materials THC consists of the following components:
1× μMECS laminate including:
3× Linkage sub-laminates; [Stainless/Epoxy/Kapton/Epoxy/Stainless] constructed from 0.0015" 2× AISI 304 FH stainless steel, 0.0005" 1× Kapton HN (DuPont), and 0.001" Hanwhaflex HGB-E500EG (Hanwha L&C) epoxy film adhe-sive.
7× Spacers; AISI 304 FH stainless steel (multiple thicknesses 0.002"-0.023")
9× Unique adhesive layers; screen printed KATIOBOND 4595 (DELO) UV pre-activated adhesive.
5× Intermediate, and 1× final release steps
2× Tungsten alloy masses
1× Coil
1× Magnet Assembly (NdFeB magnet and yoke)
1× Enclosure, which includes circuit traces for external routing and bond pads for coil leads In one embodiment of the invention, THC is manufactured in 600×600 panels to achieve required tolerances using photochemical machining processes. The total THC footprint is 20.8 mm×7.9 mm, and each panel contains 50 components and fiducials for optical alignment.

Figure 18:
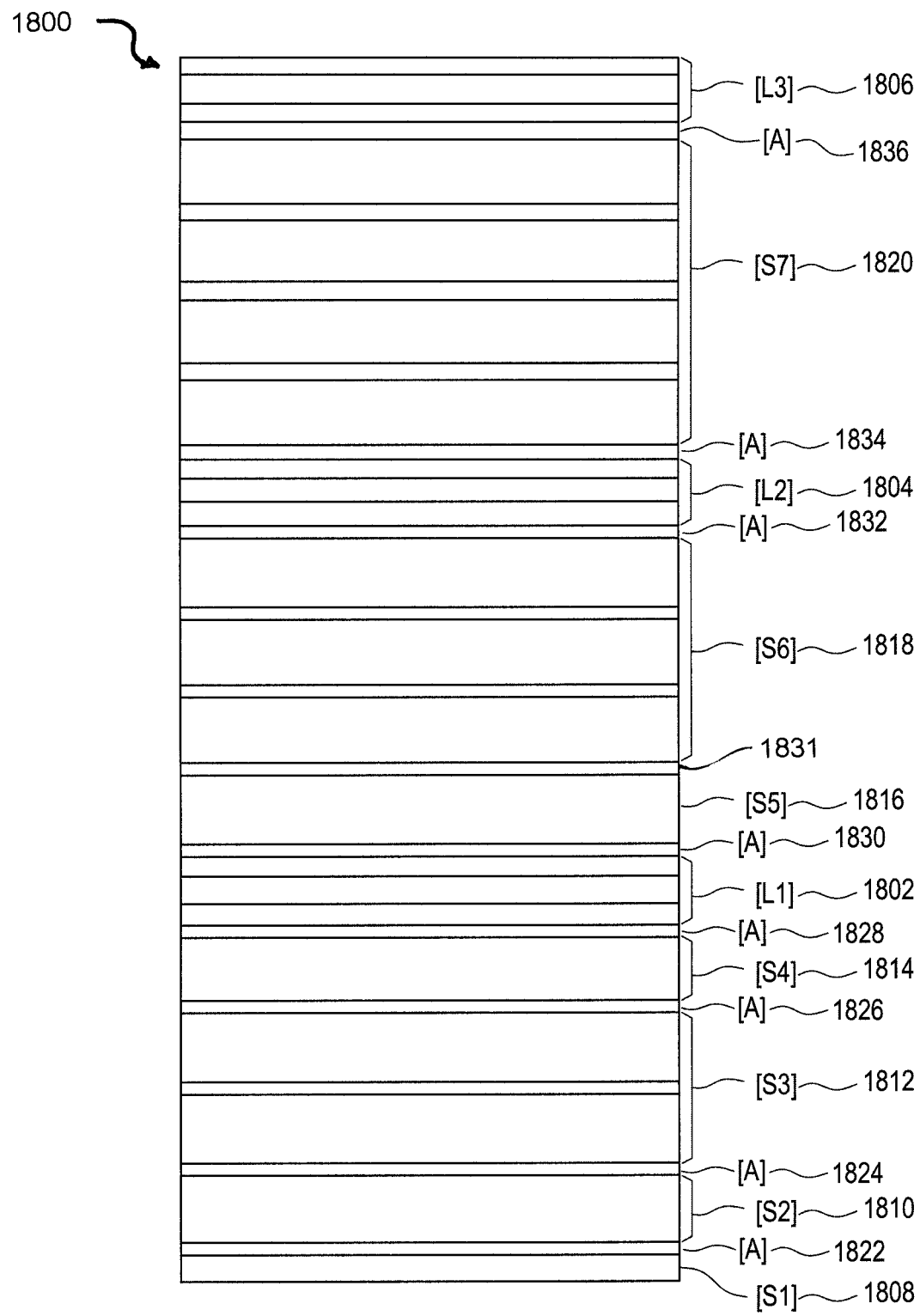
FIG. 18 illustrates, in schematic cross-section, certain additional aspects of an electro-mechanical device prepared by a method according to principles of the invention.

FIG. 18 shows in schematic cross-section, a portion of a laminate composite structure 1800 highlighting certain linkages, spaces and printed adhesive within the THC. As will be evident upon inspection of the figure, the illustrated laminate includes three linkage laminates, seven spaces and nine unique printed adhesive layers. These elements are illustrated as follows, including linkage layers [L1] 1802, [L2] 1804, and [L3] 1806. Also included are spacer layers [S1] 1808, [S2] 1810, [S3] 1812, [S4] 1814, [S5] 1816, [S6] 1818 and [S7] 1820. These elements are substantially firmly coupled to one another with the illustrated adhesive layers 1822, 1824, 1826, 1828, 1830, 1831, 1832, 1834 and 1836.

Figure 19:
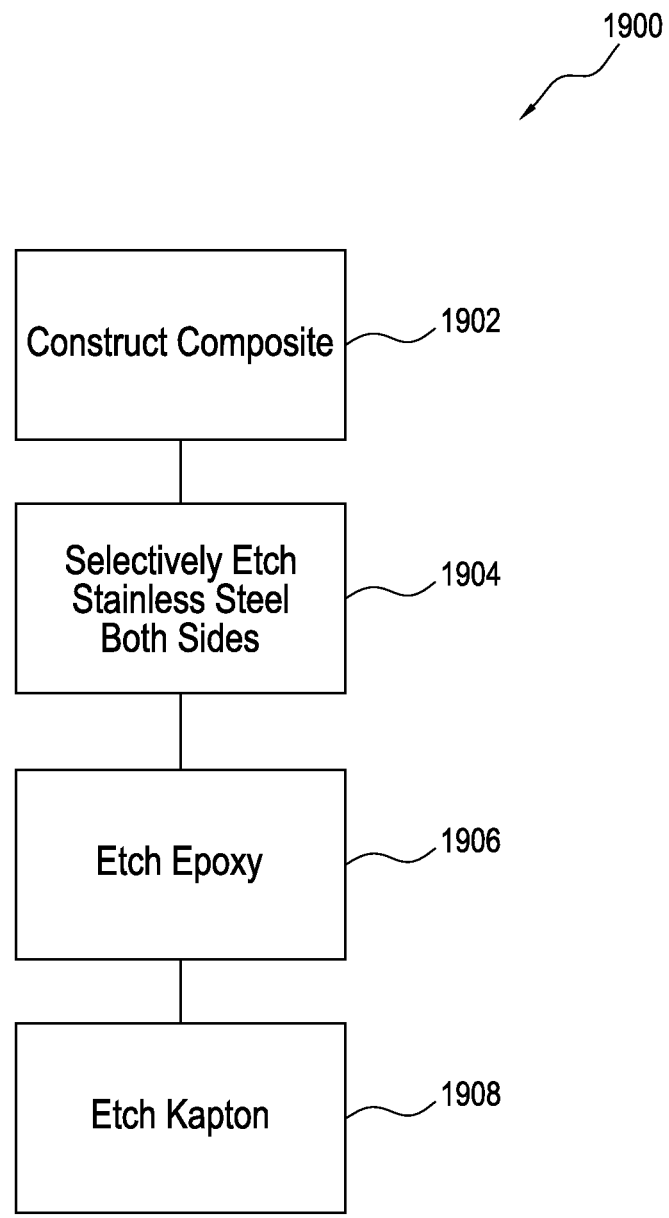
FIG. 19 illustrates, in flow diagram form, certain further aspects of a manufacturing method according to principles of the invention.
Figure 20A:
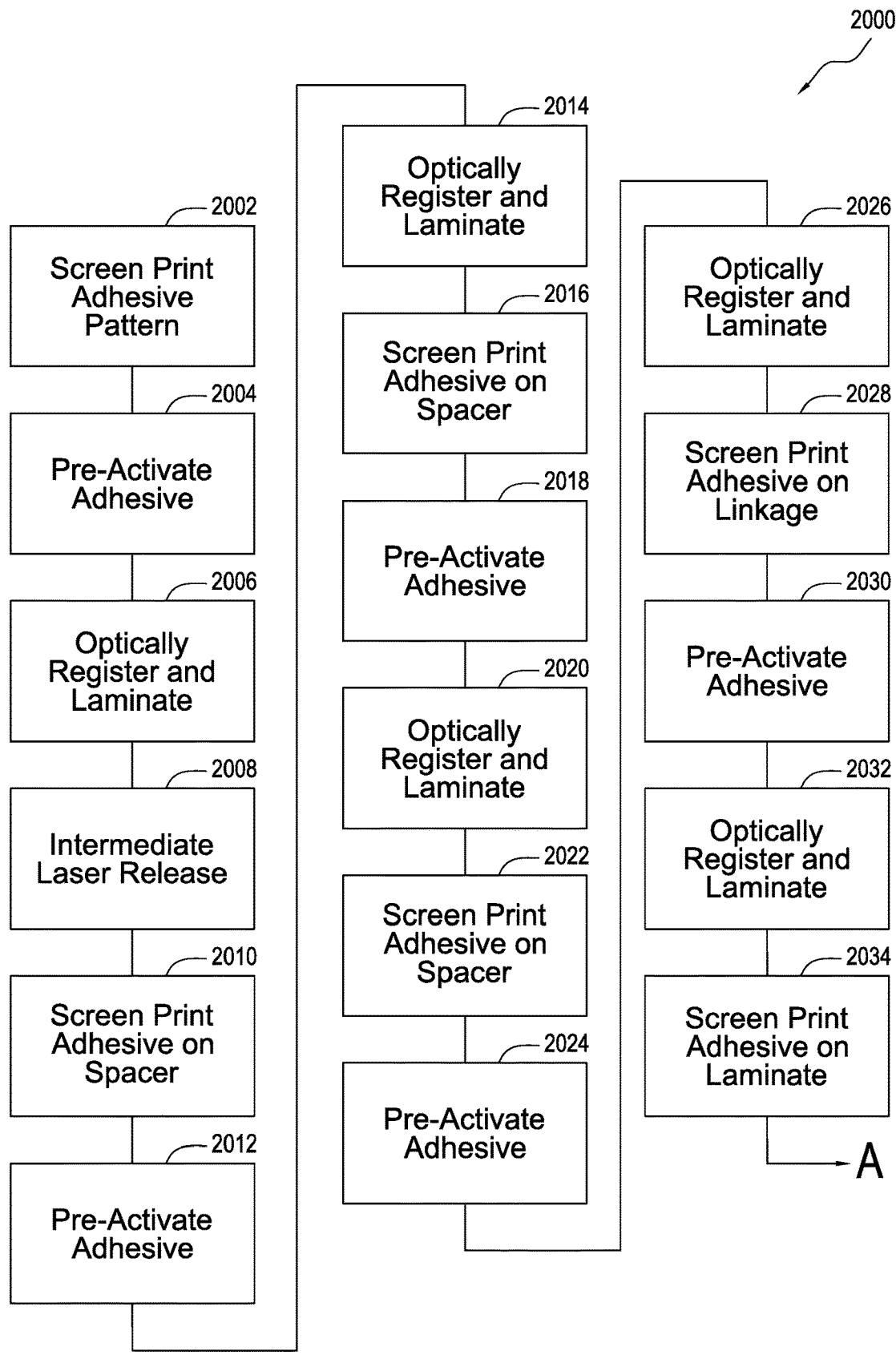
FIGS. 20A-20D illustrate, in flow diagram form, a manufacturing process for manufacturing µMECS™ electromechanical device prepared according to principles of the invention.
Figure 20B:
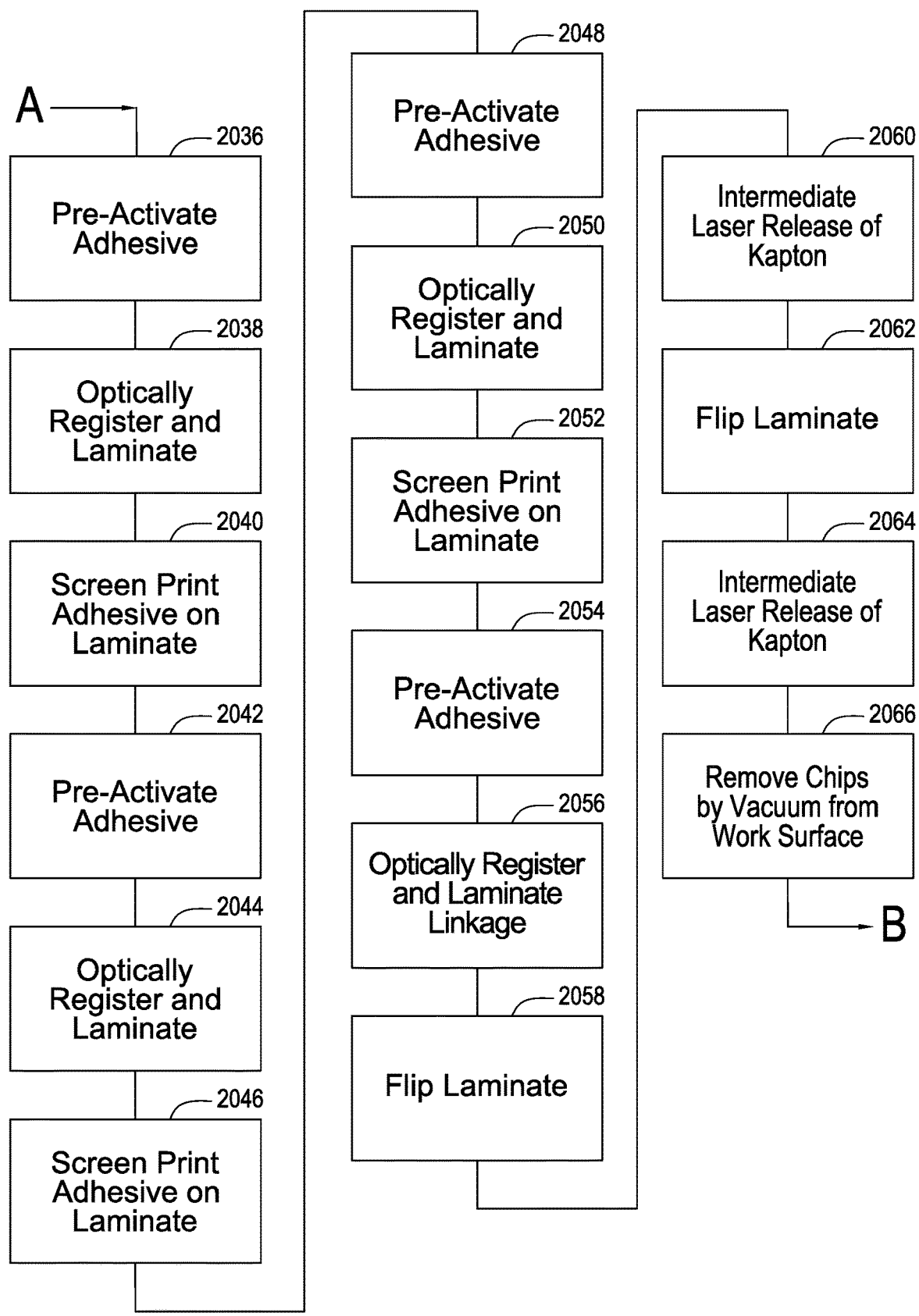
Figure 20C:
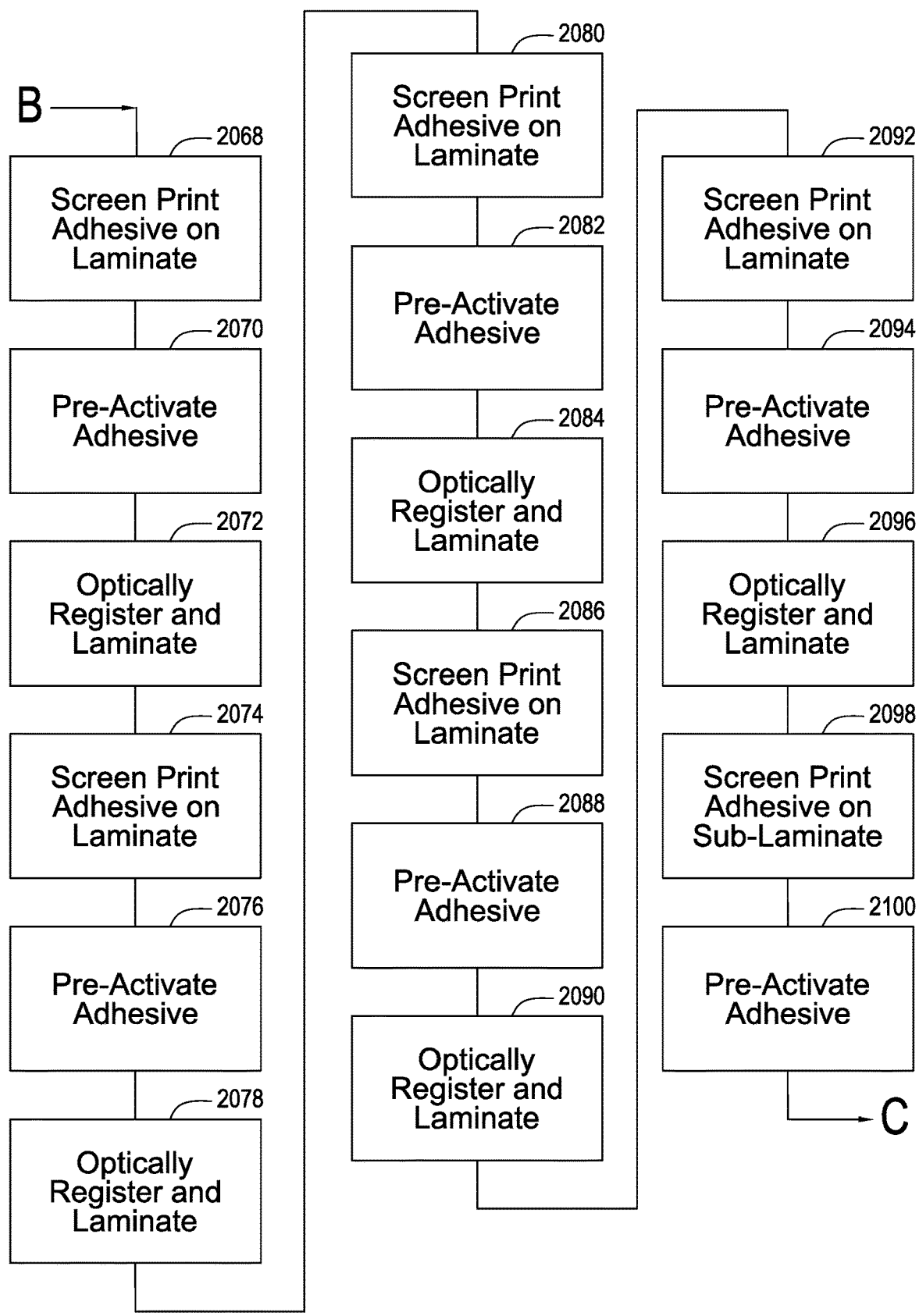
Figure 20D:
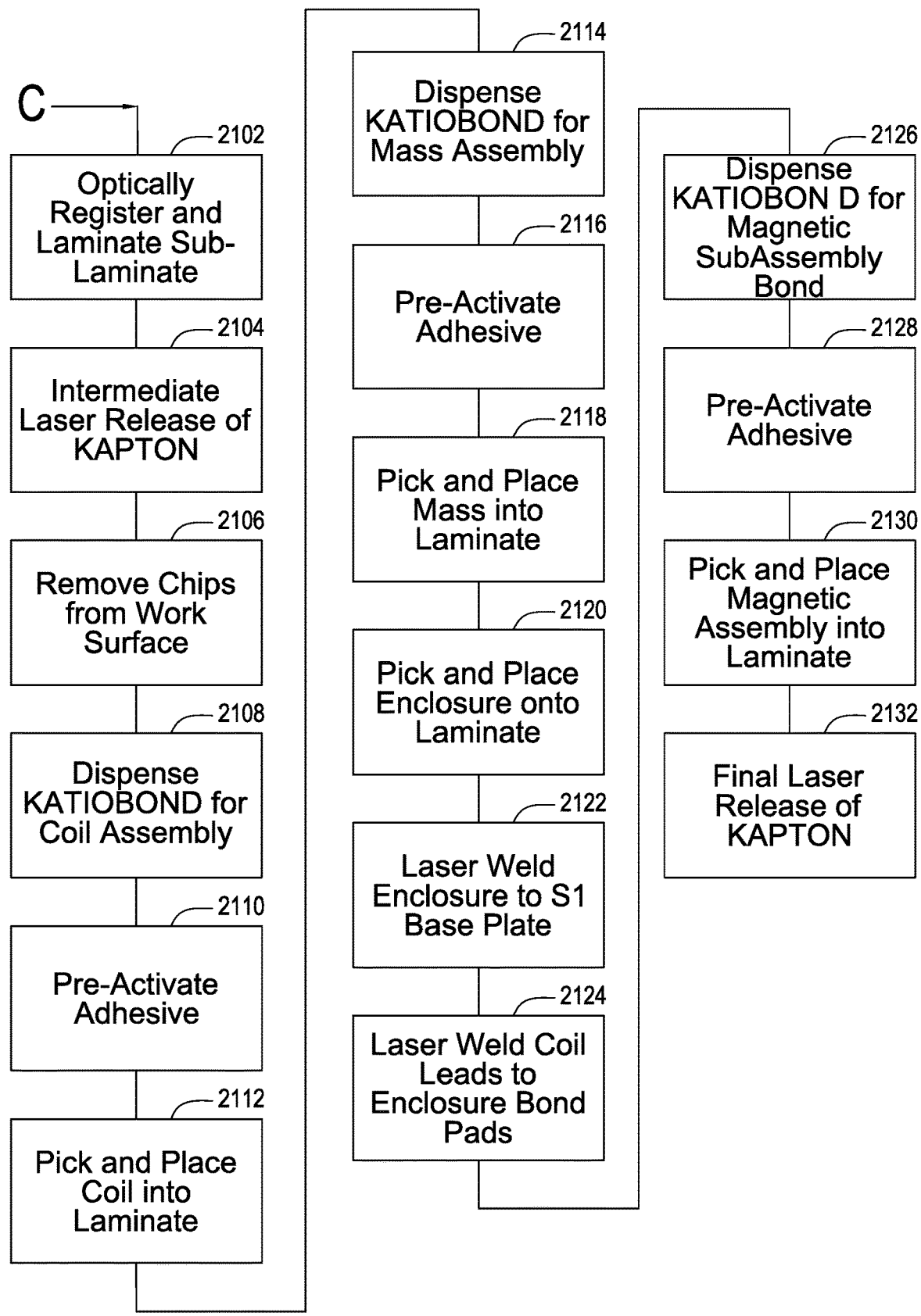

The general process to fabricate S2-S7 spacers on carrier, using three photo-tools per unique sub-laminate is shown in FIG. 19, in which the process is designated 1900 and includes the steps of:
1) Construct 1902 the [Stainless/Epoxy/Kapton/Epoxy/Stainless] composite.
2) Selectively etch 1904 through both sides of stainless steel (two masks), followed by epoxy etch 1906, to pattern substrate and chip features.
3) Selectively etch 1908 through Kapton from one side (one mask); the Kapton ply retains all features to webbing by bridges.
Spacers S3, S6, and S7 are constructed using two, three, and four sub-laminates, respectively. S1 is a single-sided 0.002" [0.001" stainless/0.0005" epoxy/0.0005" Kapton] composite, requiring only two photo-tools.

FIG. 20 A-D Illustrates, in flow diagram form, a portion of a detailed assembly process 2000 for an exemplary μMECS™ device prepared according to principles of the invention. With three linkage and thirteen spacer sub-laminates in hand, the μMECS assembly process can begin. The lamination adhesive is light curing KATIOBOND 45952 (DELO). The selected adhesive is a thixotropic paste and can be screen printed to 0.016"/0.006" trace and space with 0.001" bond line. KATIOBOND 45952 is pre-activated using 460 nm light for 5 seconds at 55 mW/cm2 intensity. Open time after pre-activation is 18 seconds. Final cure strength is reached 24 hours after exposure, however laminates are sufficiently bonded for further processing immediately following the open time.

The following lamination process 2000 is used to manufacture THC (see FIG. 9). For shorthand, refer to Linkages 1-3 as [L1] . . . [L3], spacers [S1] . . . [S7], and printed adhesive patterns identified by their adjoining sub-laminate (e.g. [L1-S5]).
1) Screen print adhesive 2002 pattern [S1-S2] onto spacer [S1] (12 s/panel).

2) Pre-activate adhesive 2004 with 460 nm light (5 s/panel).
3) Optically register and Laminate 2006 spacer [S2] to [S1] (18 s/panel).
4) Intermediate laser (355 nm UV) Release 2008 of Kapton in [S1/S2] (3 s/part).
5) Screen print adhesive 2010 pattern [S2-S3] onto spacer [S2] (12 s/panel).
6) Pre-activate adhesive 2012 (5 s/panel).
7) Optically register and Laminate 2014 spacer [S3a] to [S1/S2] (18 s/panel).
8) Screen print adhesive 2016 pattern [S3-S3] onto spacer [S1/S2/S3a] (12 s/panel).
9) Pre-activate adhesive 2018 (5 s/panel).
10) Optically register and Laminate 2020 spacer [S3b] to [S1/S2/S3a] (18 s/panel).
11) Screen print adhesive 2022 pattern [S3-S4] onto spacer [S1/S2/S3] (12 s/panel).
12) Pre-activate adhesive 2024 (5 s/panel).
13) Optically register and Laminate 2026 spacer [S4] to [S1/S2/S3] (18 s/panel). Set sub-laminate [S1/S2/S3/S4] aside.
14) Screen print adhesive 2028 pattern [L1-S5] onto linkage [L1] (12 s/panel).
15) Pre-activate adhesive 2030 (5 s/panel).
16) Optically register and Laminate 2032 spacer [S5] to [L1] (18 s/panel).
17) Screen print adhesive 2034 pattern [S5-S6] onto laminate [L1/S5] (12 s/panel).
18) Pre-activate adhesive 2036 (5 s/panel).
19) Optically register and Laminate 2038 spacer [S6a] to [L1/S5] (18 s/panel).
20) Screen print adhesive 2040 pattern [S6-S6] onto laminate [L1/S5/S6a] (12 s/panel).
21) Pre-activate adhesive 2042 (5 s/panel).
22) Optically register and Laminate 2044 spacer [S6b] to [L1/S5/S6a] (18 s/panel).
23) Screen print adhesive 2046 pattern [S6-S6] onto laminate [L1/S5/S6ab] (12 s/panel).
24) Pre-activate adhesive 2048 (5 s/panel).
25) Optically register and Laminate 2050 spacer [S6c] to [L1/S5/S6ab] (18 s/panel).
26) Screen print adhesive 2052 pattern [S6-L2] onto laminate [L1/S5/S6] (12 s/panel).
27) Pre-activate adhesive 2054 (5 s/panel).
28) Optically register and Laminate 2056 linkage [L2] to [L1/S5/S6] (18 s/panel).
29) Flip laminate 2058 [L1/S5/S6/L2] (1 s/panel).
30) Intermediate laser (355 nm UV) Release 2060 of Kapton in [L2/S6/S5/L1] (3 s/part)
31) Flip laminate 2062 [L2/S6/S5/L1] (1 s/panel).
32) Intermediate laser (355 nm UV) Release 2064 of Kapton in [L1/S5/S6/L2] (3 s/part)
33) Remove Chips 2066 by vacuum from the work surface.
34) Screen print adhesive 2068 pattern [L2-S7] onto laminate [L1/S5/S6/L2] (12 s/panel) face.
35) Pre-activate adhesive 2070 (5 s/panel).
36) Optically register and Laminate 2072 linkage [S7a] to [L1/S5/S6/L2] (18 s/panel).
37) Screen print adhesive 2074 pattern [S7-S7] onto laminate [L1/S5/S6/L2/S7a] (12 s/panel)
38) Pre-activate adhesive 2076 (5 s/panel).
39) Optically register and Laminate 2078 linkage [S7b] to [L1/S5/S6/L2/S7a] (18 s/panel).
40) Screen print adhesive 2080 pattern [S7-S7] onto laminate [L1/S5/S6/L2/S7ab] (12 s/panel)
41) Pre-activate adhesive 2082 (5 s/panel).
42) Optically register and Laminate 2084 linkage [S7c] to [L1/S5/S6/L2/S7ab] (18 s/panel).
43) Screen print adhesive 2086 pattern [S7-S7] onto laminate [L1/S5/S6/L2/S7abc] (12 s/panel)
44) Pre-activate adhesive 2088 (5 s/panel).
45) Optically register and Laminate 2090 linkage [S7d] to [L1/S5/S6/L2/S7abc] (18 s/panel).
46) Screen print adhesive 2092 pattern [S7-L3] onto laminate [L1/S5/S6/L2/S7] (12 s/panel)
47) Pre-activate adhesive 2094 (5 s/panel).
48) Optically register and Laminate 2096 linkage [L3] to [L1/S5/S6/L2/S7] (18 s/panel). Set sub-laminate [L1/S5/S6/L2/S7/L3] aside.
49) Screen print adhesive 2098 pattern [S4-L1] onto sub-laminate [S1/S2/S3/S4] (12 s/panel).
50) Pre-activate adhesive 2100 (5 s/panel).
51) Optically register and Laminate 2102 sub-laminate [L1/S5/S6/L2/S7] to [S1/S2/S3/S4] (18 s/panel).
52) Intermediate laser (355 nm UV) Release 2104 of Kapton in [S1/S2/S3/S4/L1/S5/S6/L2/S7/L3] (11 s/part).
53) Remove Chips 2106 by vacuum from work surface.
54) Dispense KATIOBOND 45952 for Coil 2108 assembly (0.3 s/part).
55) Pre-activate adhesive 2110 (5 s/panel).
56) Pick and Place Coil 2112 into the laminate (0.3 s/part).
57) Dispense KATIOBOND 45952 for Mass 2114 assembly (0.6 s/part).
58) Pre-activate adhesive 2116 (5 s/panel).
59) Pick and Place Mass (2× per part) into the laminate 2118 (0.6 s/part).
60) Pick and Place 2120 Enclosure onto the laminate (0.3 s/part).
61) Laser Weld 2122 Enclosure to S1 base plate (0.3 s/part).
62) Laser Weld 2124 Coil leads to Enclosure bond pads (0.3 s/part). Flip laminate [S1/S2/S3/S4/L1/S5/S6/S6/L2/S7/L3] (1 s).
63) Dispense KATIOBOND 45952 for Magnetic Sub-Assembly 2126 bond (0.3 s/part).
64) Pre-activate adhesive 2128 (5 s/panel).
65) Pick and Place Magnetic Sub-Assembly 2130 into the laminate (0.3 s/part).
66) Final laser (355 nm UV) Release 2132 of Kapton in [L3/S7/L2/S6/S5/L1/S4/S3/S2/S1] (15 s/part). The part will fall from webbing.

The μMECS™ technology of the present invention will, in its various embodiments, be practiced in a diverse set of materials including those now known in the art and those yet to be discovered. Virtually any material in sheet, foil or film for can be included in a μMECS™ laminate. However, a presently preferred set of materials prevails in most current μMECS™ fabrication based on material properties, cost, and manufactura-bility. The following is a short-list of materials, sorted by function, commonly used in μMECS™ components with large market applications.

Rigid structural (e.g. linkage and spacer), 0.001-0.01" sheet/foil/film: Stainless steel, Cold rolled steel, Aluminum, Copper, Polyimide, Polyester Flexure, 0.0003-0.002" film: Polyimide (e.g. Kapton), Polyester (e.g. Mylar)

Adhesive, 0.0001-0.002" cured bond line: Epoxies, Acrylics

As previously discussed, a process like that exemplified above with respect to the THC module will be beneficially applied to a wide variety of other millimeter scale electromechanical devices and systems. Accordingly, and with the intention of providing additional non-limiting examples, it will be understood that μMECS™ technology is applicable to the production various devices as discussed below.

FIGS. 21A and 21B show respectively, in linkage schematic form, a low-energy operational state 2100 and a high-energy operational state 2102 of a haptic actuator device prepared at millimeter scale and employing motion controlling linkages prepared with methods according to the invention. Consistent with the THC described above, the device includes a mechanical ground 2104 (here in the form of a case). A varying electrical signal drives a voice coil 2106 in substantially linear oscillatory motion 2108 in what is here illustrated as a vertical direction.

The oscillatory motion is coupled through respective μMECS™ mechanical linkages 2110, 2112 into first 2114 and second 2116 oscillating masses. This imparts to the masses respective oscillatory motions 2118, 2120 which in the low-energy operational state 2100 remains substantially linear. When configured at or near a natural frequency of the system, the masses 2114, 2116 tend to receive and accumulate energy supplied by the voice coil 2106.

As energy accumulates, however, the system traverses a threshold resulting in a transition of the motion of the masses 2114, 2116 from the linear trajectories 2118, 2120 more complex trajectories—illustrated 2102 as respective J-trajectories 2122 2124. This change of trajectory results in a release of energy in a direction transverse to the original oscillations 2118, 2120 of the masses and is experienced by a user of the device as a "tap." It will be appreciated that a variety of other complex trajectories and configurations can be developed with devices that are prepared by processes that fall within the scope of the present invention.

FIGS. 22A and 22B show, respectively in schematic perspective view and linkage schematic form, a low-energy operational state 2200 and a high-energy operational state 2202 of a further haptic actuator device prepared at millimeter scale according to principles of the invention. Like the device of 21A and 21B, this device accumulates energy from an internal motor when operating in its low-energy state. In contrast to the device discussed above, this energy is stored in angular momentum, rather than oscillating linear momentum. Nevertheless, when the device makes a transition from operational state 2200 to operational state 2202, a portion of the stored energy is converted into a helical motion having upward component 2204 and resulting in a "tap" signal perceptible to a user outside of the system. It should be noted that certain embodiments of a haptic actuator prepared in this configuration can produce an extremely precise haptic signal.

FIG. 23A illustrates, in schematic cross-section, a substantially conventional Linear Resonant Actuator (LRA) 2300. The LRA includes mechanical ground 2302 in the form of a case, a Piezo electric driver 2304, and an oscillating mass 2306 driven by the Piezo electric driver 2304. When operating near a natural frequency of the system, a substantial mechanical output can be produced.

However, as illustrated in FIG. 23B, a similar signal can be produced, by a device 2308 prepared according to principles of the invention, within a smaller spatial volume when the Piezo electric actuator 2310 drives the mass 2312 through a single stage μMECS™ linkage 2314. Moreover, a similar effect can be produced while operating the Piezo electric actuator at a lower frequency.

FIG. 23C shows a further μMECS™ device 2316 in which a two-stage linkage 2318 is employed.

FIGS. 24A and 24B compare conventional acoustic transducers 2400, 2402 to μMECS™ technology acoustic transducers 2406, 2408 respectively. The practitioner of ordinary skill in the art will readily ascertain that the voice coils 2408, 2410 of the conventional devices are disposed and move coaxial to vertically oriented axes 2412, 2414.

In contrast, the driving coils 2416, 2418 of the μMECS™ devices move in a transverse direction and are coupled to respective output membranes 2420, 2422 through respective μMECS™ mechanical linkages, 2424, 2426, 2428, 2430. The result is that the μMECS™ devices exhibit improved performance including, without limitation, a superior output to volume ratio, as well as advantageous linear dimensions. In addition, a device can be prepared according to principles of the invention that produces superior bass response as compared with a similarly sized conventional device.

Figure 25:
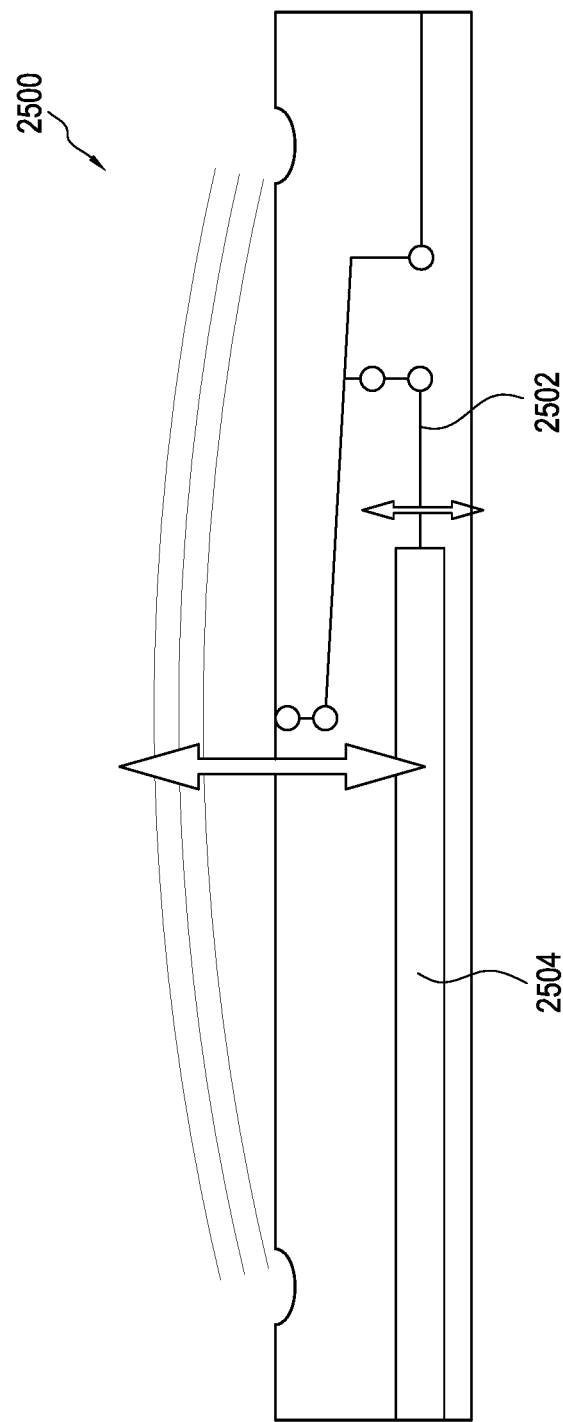
FIG. 25 illustrates, in schematic cross-section, certain aspects of an electro-mechanical device prepared by a method according to principles of the invention.

FIG. 25 similarly shows an acoustic transducer 2500 which exhibits superior output characteristics because it includes a μMECS™ mechanical linkage 2502 that serves to amplify the effect of Piezo electric driver 2504. The result, in certain embodiments, is improved efficiency and a larger acoustical output signal.

Figure 26:
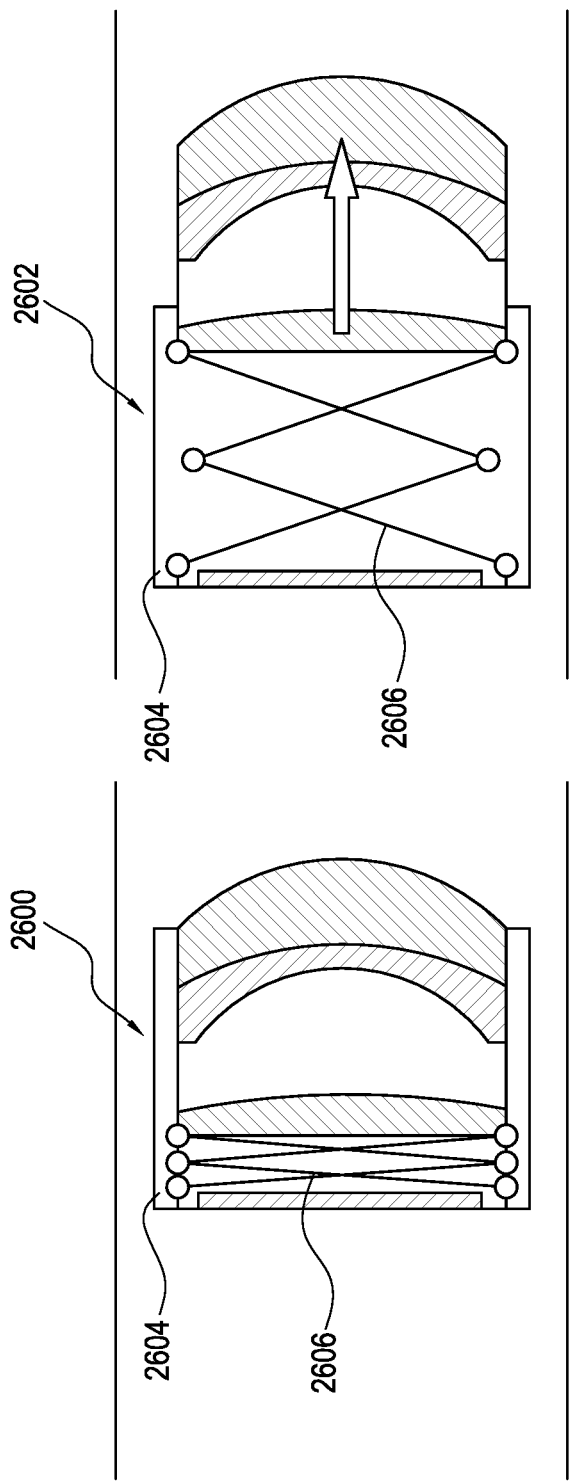
FIGS. 26A and 26B illustrate, shows in schematic cross-section, certain respective aspects and operational states of an electro-mechanical device prepared by a method according to principles of the invention.

FIGS. 26A and 26B show respective first 2600 and second operational states 2602 of an optical zoom apparatus 2604 produced at millimeter scale and employing a mechanical linkage 2606 according to principles of the invention. In light of the present disclosure, one of ordinary skill in the art will readily appreciate the nature of the device and the manner in which it operates. Moreover, the practical benefits of preparing a similar device employing the teachings of the present disclosure will likewise be readily apparent.

Figure 27:
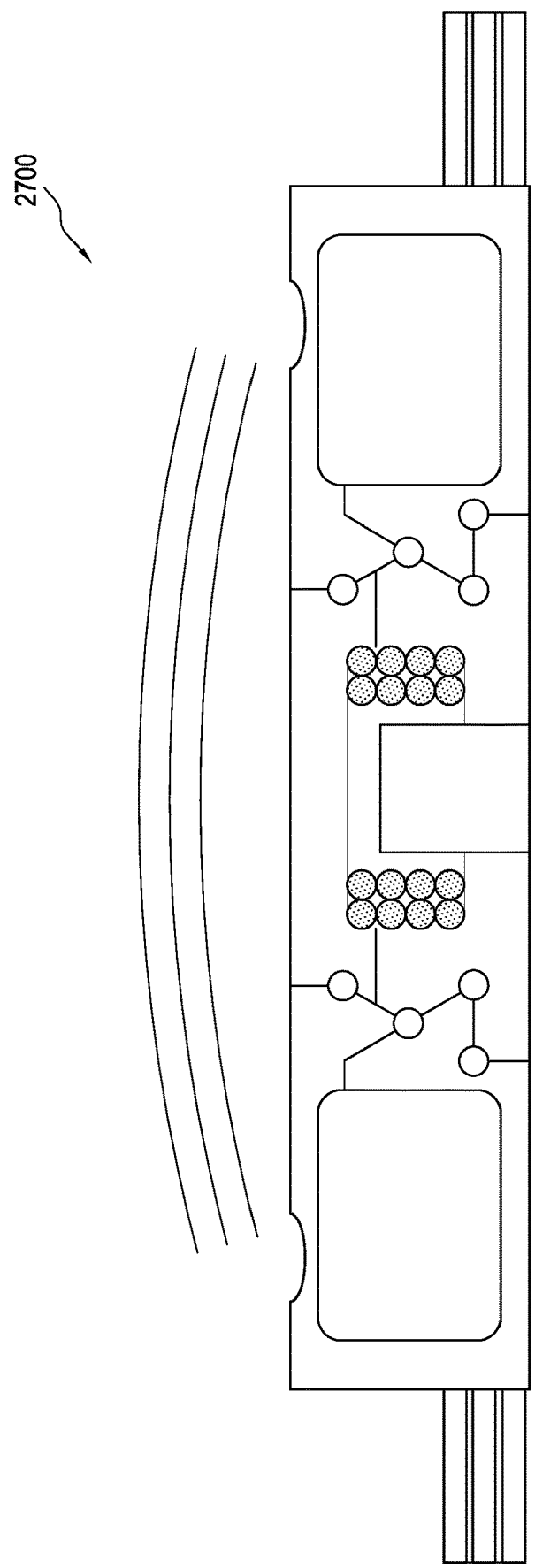
FIG. 27 illustrates, in schematic cross-section, certain aspects of a further electro-mechanical device prepared by a method according to principles of the invention.

FIG. 27 illustrates, in schematic cross-section, a portion of a combination haptic and acoustical transducer 2700. It will be apparent to one of skill in the art that the advantage of the present invention allow the creation of millimeter scale devices never before practical or anticipated.

While a variety of systems and equipment, including equipment presently available on yet yet to be developed, will be advantageously employed in the practice of the invention disclosed herewith, it may nevertheless be helpful to one of skill in the art to consider the following summary of core capital equipment.

5× Laser release modules
Galvo driven 10 W 355 nm UV DPSS Laser (e.g. LPKF MicroLine 2120 CI)
Vision system
Vacuum exhaust and chip removal
10× Lamination modules
Screen printer (e.g. SpeedPrint SP700)—
460 nm LED light array (e.g. 4× DELO DE-LOLUX 20)
Vision system
Lamination press
4× Pick and place assembly modules
SMT pick and place (e.g.
Vision system (e.g.
Adhesive delivery and dispense (e.g.—Laser welder
460 nm LED light array (e.g. 4× DELO DE-LOLUX 20)

The above is only one possible instantiation of an inline THC assembly process. Maximum throughput at each node requires 15 lamination modules (screen print, light activation, registration, and lamination), 5 laser release modules, 4 pick and place assembly modules (pick and place, adhesive dispense, and UV activation). Clever process engineering can leverage under-utilized equipment for multiple tasks, using a cellular arrangement. Using the above process time estimates, the lowest throughput process is final laser release (15 s/part, 4 PPM). A 4 PPM process can be accomplished using 1 lamination module (91 PPM), 3 laser release modules (4-8 PPM), and 1 pick and place module (10-15 PPM).

While the exemplary embodiments described above have been chosen primarily from the field of optical communication, one of skill in the art will appreciate that the principles of the invention are equally well applied, and that the benefits of the present invention are equally well realized in a wide variety of other communications systems including, for example, electronic command and control systems. Further, while the invention has been described in detail in connection with the presently preferred embodiments, it should be readily understood that the invention is not limited to such disclosed embodiments. Rather, the invention can be modified to incorporate any number of variations, alterations, substitutions, or equivalent arrangements not heretofore described, but which are commensurate with the spirit and scope of the invention. Accordingly, the invention is not to be seen as limited by the foregoing description, but is only limited by the scope of the appended claims.

The invention claimed is:

1. A high-speed method for forming a millimeter-scale linkage laminate structure comprising:
   providing a first ply of relatively rigid mechanical material, said first ply having a first surface region and a second surface region disposed in substantially parallel spaced relation to said first surface region;
   coupling said first surface region of said first ply to a second ply of sacrificial film carrier material;
   applying a patterned photoresist material to said second surface region;
   selectively etching said first ply to form at least one substrate island and at least one chip island, said substrate and chip islands being respectively coupled to said second ply of sacrificial film carrier material;
   selectively coupling said at least one substrate island to a relatively flexible ply material to form said linkage laminate structure; and
   removing said second ply of sacrificial film carrier material to release said linkage laminate structure from said sacrificial film carrier material and said at least one chip island.

2. A high-speed method as defined in claim 1 wherein said second ply of sacrificial film carrier material comprises a soluble film material and where said removing said second ply of sacrificial film carrier material comprises dissolving said sacrificial film carrier material.

3. A high-speed method as defined in claim 2 wherein said soluble film material comprises an isopropynol-soluble material.

4. A high-speed method as defined in claim 1 wherein said second ply of sacrificial film carrier material comprises a thermally decomposing film material and where said removing said second ply of sacrificial film carrier material comprises decomposing said sacrificial film carrier material.

5. A high-speed method as defined in claim 4 wherein said decomposing said sacrificial film carrier material comprises chemically decomposing said sacrificial film carrier material.

6. A high-speed method as defined in claim 4 wherein said decomposing said sacrificial film carrier material comprises evaporating said sacrificial film carrier material.

7. A high-speed method as defined in claim 1 wherein said second ply of sacrificial film carrier material comprises a melting film material and where said removing said second ply of sacrificial film carrier material comprises heating said sacrificial film carrier material.

8. A high-speed method as defined in claim 7 wherein said melting film material comprises a hot melt material.

9. A high-speed method as defined in claim 7 wherein said melting film material comprises a wax material.

10. A high-speed method as defined in claim 1 wherein said second ply of sacrificial film carrier material comprises a biodegradable film material.

11. A high-speed method as defined in claim 10 wherein said biodegradable film material comprises a biodegradable polyethylene terephthalate (PET) material.

12. A high-speed method as defined in claim 1 wherein said first ply of relatively rigid mechanical material comprises a metallic material.

13. A high-speed method as defined in claim 1 wherein said selectively etching said first ply comprises etching said first ply in a batch processing tank system.

14. A high-speed method as defined in claim 1 wherein said selectively coupling said at least one substrate island to a relatively flexible ply material comprises adhesive jet printing an adhesive material onto a surface region of said at least one substrate island and, thereafter, disposing said relatively flexible ply material into contact with said adhesive material.

15. A high-speed method as defined in claim 1 wherein said selectively coupling said at least one substrate island to a relatively flexible ply material comprises disposing a die cut adhesive film onto a surface region of said at least one substrate island and, thereafter, disposing said relatively flexible ply material into contact with said die cut adhesive film.

16. A high-speed method as defined in claim 1 wherein said selectively coupling said at least one substrate island to a relatively flexible ply material comprises adhesive transfer printing an adhesive material onto a surface region of said at least one substrate island and, thereafter, disposing said relatively flexible ply material into contact with said adhesive material.

17. A high-speed method as defined in claim 1 wherein said selectively coupling said at least one substrate island to a relatively flexible ply material comprises adhesive spraying an adhesive material onto a surface region of said at least one substrate island and, thereafter, disposing said relatively flexible ply material into contact with said adhesive material.

18. A high-speed method as defined in claim 1 wherein said selectively coupling said at least one substrate island to a relatively flexible ply material comprises screen printing an adhesive material onto a surface region of said at least one substrate island and, thereafter, disposing said relatively flexible ply material into contact with said adhesive material.

* * * * *